United States Patent
Ohshima

(10) Patent No.: US 6,392,859 B1
(45) Date of Patent: May 21, 2002

(54) SEMICONDUCTOR ACTIVE FUSE FOR AC POWER LINE AND BIDIRECTIONAL SWITCHING DEVICE FOR THE FUSE

(75) Inventor: Shunzou Ohshima, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/502,214

(22) Filed: Feb. 11, 2000

(30) Foreign Application Priority Data

Feb. 14, 1999 (JP) ........................................... 11-074257

(51) Int. Cl.⁷ ................................................. H02H 1/00
(52) U.S. Cl. ...................................................... 361/100
(58) Field of Search ..................... 257/161; 327/108, 327/427; 361/100; 323/282

(56) References Cited

U.S. PATENT DOCUMENTS

| | | | |
|---|---|---|---|
| 4,574,266 A | | 3/1986 | Valentine .................... 340/635 |
| 5,125,066 A | * | 6/1992 | Ishiguro et al. ............. 385/142 |
| 5,361,008 A | * | 11/1994 | Saijo .......................... 327/427 |
| 5,764,041 A | * | 6/1998 | Pulvirenti et al. .......... 323/282 |
| 5,808,327 A | * | 9/1998 | Maier ......................... 257/161 |
| 6,229,355 B1 | * | 2/2000 | Ogasawara .................. 327/108 |
| 6,130,575 A | * | 10/2000 | Nelson et al. .............. 327/540 |

FOREIGN PATENT DOCUMENTS

| | | |
|---|---|---|
| EP | 0 515 961 A1 | 6/1997 |
| JP | 01-227520 | 9/1989 |
| JP | 02-266836 | 10/1990 |
| JP | 03-262209 | 11/1991 |
| JP | 04-134271 | 5/1992 |
| JP | 05-052880 | 3/1993 |
| JP | 06-027157 | 2/1994 |
| JP | 06-061432 | 3/1994 |
| JP | 06-188704 | 7/1994 |
| JP | 06-244693 | 9/1994 |
| JP | 09-145749 | 6/1997 |
| WO | WO 95/07571 | 9/1994 |

* cited by examiner

*Primary Examiner*—Peter S. Wong
*Assistant Examiner*—Pia Tibbits
(74) *Attorney, Agent, or Firm*—Finnegan, Henderson, Farabow, Garrett & Dunner, L.L.P.

(57) ABSTRACT

A bidirectional switching device has a first main semiconductor element and a second main semiconductor element. The first main semiconductor element has a first main electrode connected to an ungrounded side of an AC power source, and a second main electrode. The first main semiconductor element contains a first parasitic diode whose cathode region is connected to the first main electrode and whose anode region is connected to the second main electrode. The second main semiconductor element has a third main electrode connected to the second main electrode, and a fourth main electrode connected to a load. The second main semiconductor element contains a second parasitic diode whose anode region is connected to the third main electrode and whose cathode region is connected to the fourth main electrode. A current flowing from the first main semiconductor element toward the second main semiconductor element passes through the second parasitic diode, and a current flowing from the second main semiconductor element toward the first main semiconductor element passes through the first parasitic diode. The bidirectional switching device is used to form a semiconductor active fuse for an AC power system. The semiconductor active fuse is capable of detecting an overcurrent without a shunt resistor, which was connected in series to a power supply cable, thereby minimizing heat dissipation as well as a conduction loss. The semiconductor active fuse is capable of easily and speedily detecting not only an overcurrent caused by a dead short but also an abnormal current caused by an incomplete short circuit failure having a certain extent of short-circuit resistance, and breaking alternating current in an AC power supply cable.

22 Claims, 16 Drawing Sheets

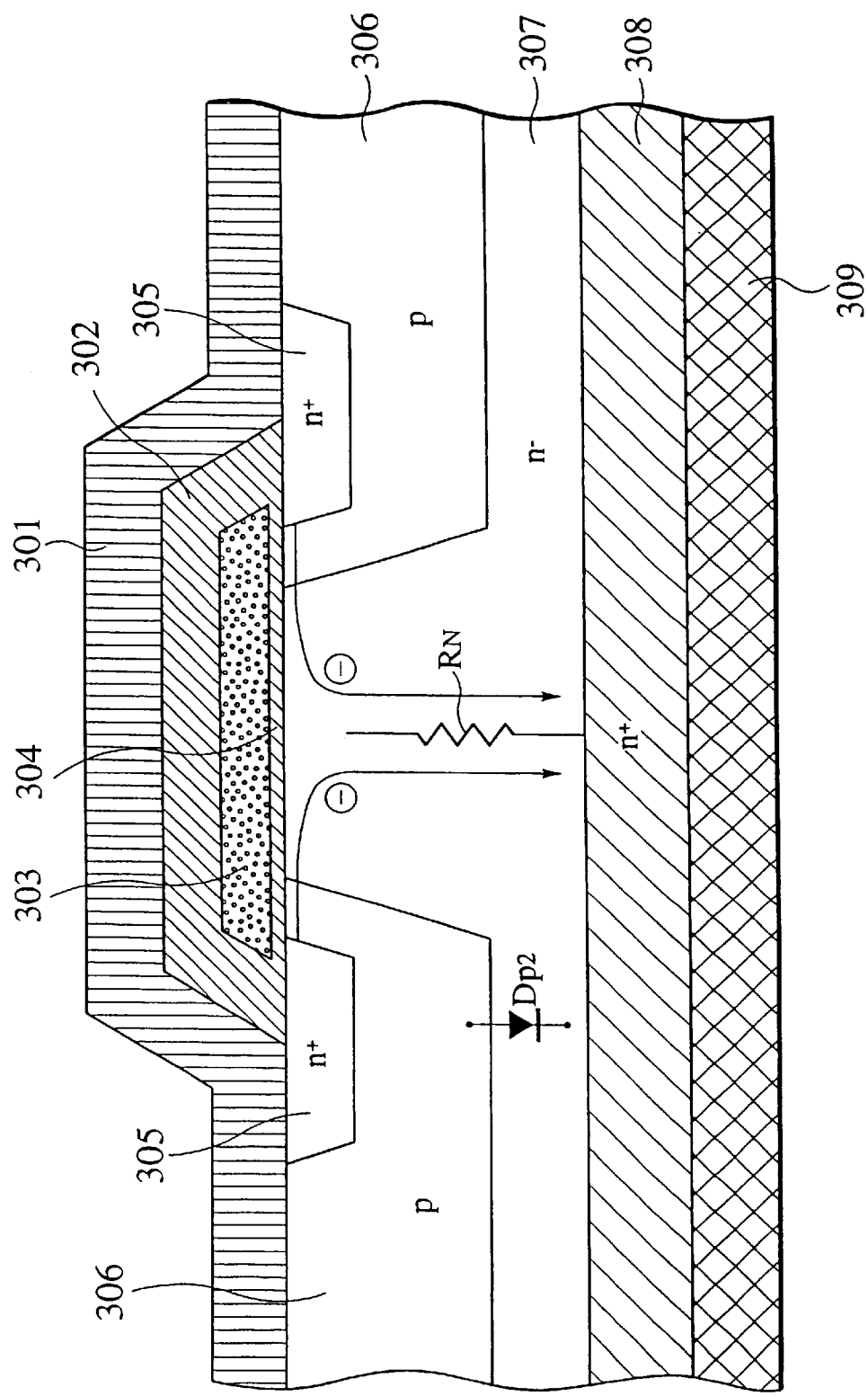

SEMICONDUCTOR ACTIVE FUSE FOR AC POWER LINE AND BIDIRECTIONAL SWITCHING DEVICE FOR THE FUSE

BACKGROUND OF THE INVENTION

1. Field of the Invention

The present invention relates to a bidirectional switching device for switching alternating current and an AC semiconductor active fuse employing the bidirectional switching device.

2. Description of the Related Art

FIG. 1 shows a direct current supply/control apparatus according to a related art. The direct current supply/control apparatus has a switching element QF having a temperature sensor. The switching element QF controls the supply of power from a DC power source to a load. The DC power source 101 supplies a DC output voltage VB. The power source 101 is connected to an end of a shunt resistor RS. The other end of the shunt resistor RS is connected to a drain electrode D of the switching element QF whose source electrode S is connected to the load 102. The load 102 is, for example, a headlight or a power window motor of a vehicle. The bidirectional switching device also has a driver 901 for detecting a current flowing through the shunt resistor RS and controlling the switching element QF accordingly, an A/D converter 902, and a microcomputer (CPU) 903 for turning on and off a drive signal for the switching element QF according to the current detected by the driver 901 When the temperature of the switching element QF increases, the switching element QF is turned off.

A Zener diode ZD1 is connected between the gate and source of a power element QM serving as a main semiconductor element of the switching element QF. The Zener diode ZD1 keeps a voltage of 12 V between the gate electrode G and source electrode S of the switching element QF to bypass an overvoltage so that the overvoltage may not be applied to the true gate TG of the switching element QF. The driver 901 has differential amplifiers 911 and 913 serving as a current monitor circuit, a differential amplifier 912 serving as a current limiter, and a charge pump 915. The driver 901 incorporates a driver 914 for receiving an ON/OFF control signal from the microcomputer 903 and an overcurrent signal from the current limiter, and according to these signals, driving the true gate TG of the switching element QF through an internal resistor RG. If an overcurrent exceeding an upper limit is detected by the differential amplifier 912 according to a voltage drop across the shunt resistor RS, the driver 914 turns off the switching element QF. If the overcurrent drops below a lower limit, the driver 914 turns on the switching element QF. On the other hand, the microcomputer 903 always monitors a current through the current monitor circuit made of the differential amplifiers 911 and 913. Upon detecting an abnormal current exceeding a normal level, the microcomputer 903 issues an OFF signal to the switching element QF to turn off the switching element QF. If the temperature of the switching element QF exceeds a predetermined level before the microcomputer 903 issues the OFF signal, a temperature sensor 121 issues a signal to turn off the switching element QF.

To detect a current, the related art must have the shunt resistor RS in a power supply cable. If a large current flows through the shunt resistor RS, the shunt resistor RS will cause a large heat dissipation The large heat dissipation is waste of electric energy and needs a cooler, which complicates and enlarges the supply/control apparatus.

The direct current supply/control apparatus of the related art may work on a dead short that occurs in the load 102 or wiring to produce a large short-circuit current. However, the supply/control apparatus unsatisfactorily works on an incomplete short circuit failure having a certain extent of short-circuit resistance to produce a weak short-circuit current. Only way for the related art to cope with such incomplete short circuit failures is to detect an abnormal current caused by the short circuit failure with the use of the microcomputer 903 and current monitor circuit and turn off the switching element QF by the microcomputer 903. The microcomputer 903 is expensive and is slow to respond to such an abnormal current.

The shunt resistor RS, A/D converter 902, and microcomputer 903 that are imperative for the related art need a large space and are expensive, to increase the size and cost of the supply/control apparatus.

In addition to these problems, there is no related art that provides a bidirectional switching device or "an AC semiconductor active fuse" capable of operating on an AC power supply cable to disconnect the AC power supply cable upon detecting an abnormal current.

The reason why there is no bidirectional switching device or AC semiconductor active fuse is mainly because a control circuit for controlling a bidirectional switching device inserted in an AC power supply cable is difficult to design A control circuit for handling small signals usually operates on a voltage of, for example, 6 V, and it is very difficult to design a control circuit that withstands a commercial AC voltage of about 100–130 V Further difficulty lies in monolithically integrating a bidirectional switching device and its control circuit into a power device.

SUMMARY OF THE INVENTION

An object of the present invention is to provide a bidirectional switching device capable of serving for an AC power supply cable, detecting an abnormal current, and disconnecting the AC power supply cable accordingly.

Another object of the present invention is to provide a bidirectional switching device capable of detecting alternating current without a shunt resistor in an AC power supply cable.

Still another object of the present invention is to provide a bidirectional switching device that is easy to integrate and is manufacturable at low cost.

Still another object of the present invention is to provide an AC semiconductor active fuse capable of serving for an AC power supply cable.

Still another object of the present invention is to provide an AC semiconductor active fuse capable of suppressing heat dissipation in an AC power supply cable and efficiently supplying AC power, Still another object of the present invention is to provide an AC semiconductor active fuse that is small and light and needs no labor for replacement.

Still another object of the present invention is to provide an AC semiconductor active fuse capable of speedily responding to an abnormal current caused by an incomplete short circuit failure having a certain extent of short-circuit resistance.

Still another object of the present invention is to provide an AC semiconductor active fuse whose breaking speed for an incomplete short circuit failure is adjustable.

Still another object of the present invention is to provide a structure for a semiconductor switch employed by an AC semiconductor active fuse, to reduce the size and cost of the fuse.

Still another object of the present invention is to provide an AC semiconductor active fuse having a control circuit that withstands the commercial AC voltage.

Still another object of the present invention is to provide a bidirectional switching device and a control circuit that controls the bidirectional switching device and withstands the commercial AC voltage, to form monolithically an AC semiconductor active fuse on a semiconductor chip.

Still another object of the present invention is to provide an AC semiconductor active fuse capable of detecting an abnormal current without intricate, expensive hardware such as a microcomputer and being small, light, and inexpensive.

Still another object of the present invention is to provide an AC semiconductor active fuse having uniform characteristics, employing no precision capacitors or resistors, and minimizing detection errors.

Still another object of the present invention is to provide an AC semiconductor active fuse that needs no external capacitor and is small and manufacturable at low cost.

Still another object of the present invention is to provide an AC semiconductor active fuse that is compact to improve space efficiency in a semiconductor chip and is manufacturable at low cost.

In order to accomplish the objects, a first feature of the present invention inheres in a bidirectional switching device for an AC semiconductor active fuse, having a novel structure. The bidirectional switching device consists of a p-channel first main semiconductor element and an n-channel second main semiconductor element. The first main semiconductor element has a first main electrode connected to an ungrounded side of an AC power source, a second main electrode opposing to the first main electrode, and a first control electrode for controlling a main current flowing between the first and second main electrodes. The first main semiconductor element contains a first parasitic diode whose cathode region is connected to the first main electrode and whose anode region is connected to the second main electrode. The second main semiconductor element has a third main electrode connected to the second main electrode, a fourth main electrode opposing to the third main electrode and connected to a load, and a second control electrode for controlling a main current flowing between the third and fourth main electrodes. The second main semiconductor element contains a second parasitic diode whose anode region is connected to the third main electrode and whose cathode region is connected to the fourth main electrode. The first and second main semiconductor elements may be vertical-type power MOS transistors having a DMOS, VMOS, or UMOS structure. Alternatively, the first and second main semiconductor elements may be MOS static induction transistors (SITs) having a similar structure. These transistors are preferable because they increase the areas of the first and second parasitic diodes. The first and second main semiconductor elements may be MOS composite device s such as emitter switched thyristors (EST) and MOS controlled thyristors (MCT). Instead, the first and second main semiconductor elements may be insulated gate power device s such as insulated gate bipolar transistors (IQBTs) Further, the first and second main semiconductor elements may be another insulated gate transistors such as metal-insulator-semiconductor (MIS) transistors, which may include high electron mobility transistors (HEMTs). If the first and second main semiconductor elements are always used with reversely-biased gates, they may be junction FETs, junctions SITs, or SI thyristors. Double-gate SI thyristors realize bidirectional switching with a low ON voltage, The first and second parasitic diodes correspond to parasitic p-n junction diodes structurally contained in the above-mentioned semiconductor elements or device s.

According to the first feature, the first and second control electrodes are grounded through resistors when energized. When the ungrounded side of the AC power source increases to be positive, the potential of the control electrode of the first main semiconductor element decreases with respect to the potential of the first main electrode, and the potential of the control electrode of the second main semiconductor element decreases with respect to the potential of the third main electrode. As a result, the p-channel first main semiconductor element turns on, and the n-channel second main semiconductor element keeps off. The first main electrode is an emitter electrode of the IGBT, a source electrode of a MOS transistor, a cathode electrode of the EST, MCT, or SI thyristor, or an equivalent main electrode of a semiconductor element equivalent to any one of these semiconductor elements. The second main electrode is a collector electrode of the IGBT, a drain electrode of the MOS transistor, or an anode electrode of the EST, MCT, or SI thyristor. Similarly, the third main electrode is an emitter electrode of the IGBT, a source electrode of the MOS transistor, or a cathode electrode of the EST, MCT, or SI thyristor. The fourth main electrode is a collector electrode of the IGBT, a drain electrode of the MOS transistor, or an anode electrode of the EST, MCT, or SI thyristor. According to the first feature, a current from the ungrounded side of the AC power source passes through the first and second main semiconductor elements to the load and to the ground, even if the second main semiconductor element is in the nonconducting state, because there is the second parasitic diode. When the ungrounded side of the AC power source decreases to be negative, the second main semiconductor element turns on to reversely pass a current through the second main semiconductor element and first parasitic diode.

Due to the first and second parasitic diodes, the first and second main semiconductor elements of the first feature function as reverse-conducting semiconductor elements. The reverse-conducting semiconductor elements may use forward and reverse current paths when employed for a bidirectional switching device. The first and second parasitic diodes are structurally formed in large areas in vertical-type semiconductor elements having a DMOS, VMOS, or UMOS structure, to reduce ON resistance. The vertical-type semiconductor elements may have a structure in which a buried electrode region is guided to the surface with a sinker region, which is a highly conductive semiconductor region. In this case, the first and second main semiconductor elements may be connected in series without increasing a conduction loss. Using the first and second parasitic diodes may reduce the number of parts of an overcurrent controller of an AC semiconductor active fuse and the whole size of the fuse.

The bidirectional switching device of the first feature may further have a first reference semiconductor element having a fifth main electrode connected to the first main electrode, a third control electrode connected to the first control electrode, and a sixth main electrode, and a second reference semiconductor element having a seventh main electrode connected to the third main electrode, a fourth control electrode connected to the second control electrode, and an eighth main electrode.

According to the first feature, the first main semiconductor element, first reference semiconductor element, second main semiconductor element, and second reference semiconductor element may monolithically be merged on a single semiconductor substrate, to reduce the size and space of the switching device. This enables the bidirectional switching device to be mass-produced to reduce the cost thereof. The first main semiconductor element, first reference semiconductor element, second main semiconductor element, and second reference semiconductor element may separately be formed in island-like semiconductor areas that are isolated and discrete In this case, the second, fourth, sixth, and eighth main electrodes are formed as buried regions at the bottoms of the island-like semiconductor areas.

The first main semiconductor element, first reference semiconductor element, second main semiconductor element, and second reference semiconductor element may be formed in individual modules, which are arranged in a single package. In this case, the first main semiconductor element, first reference semiconductor element, second main semiconductor element, and second reference semiconductor element may be formed on separate conductive plates arranged on the surface of a single package base. The second, fourth, sixth, and eighth main electrodes are directly connected to the respective conductive plates, so that they may separately be led to the outside. It is convenient to connect the second and third main electrodes to each other as an internal structure in a package.

A second feature of the present invention lies in a bidirectional switching device for an AC semiconductor active fuse The bidirectional switching device has an n-channel first main semiconductor element and an n-channel second main semiconductor element The first main semiconductor element has a first main electrode connected to an ungrounded side of an AC power source, a second main electrode opposing to the first main electrode, and a first control electrode for controlling a main current flowing between the first and second main electrodes. The first control electrode is connected to a first driver that is stepped up by a charge pump. The first main semiconductor element contains a first parasitic diode whose cathode region is connected to the first main electrode and whose anode region is connected to the second main electrode. The second main semiconductor element has a third main electrode connected to the second main electrode, a fourth main electrode opposing to the third main electrode and connected to a load, and a second control electrode for controlling a main current flowing between the third and fourth main electrodes. The second control electrode is connected to a second driver that is different from the first driver. The second main semiconductor element contains a second parasitic diode whose anode region is connected to the third main electrode and whose cathode region is connected to the fourth main electrode.

According to the second feature, the first main electrode is a collector electrode of an IGBT, a drain electrode of a MOS transistor, an anode electrode of an EST, MCT, or SI thyristor, or an equivalent main electrode of a semiconductor element equivalent to any one of these semiconductor elements. The second main electrode is an emitter electrode of the IGBT, a source electrode of the MOS transistor, or a cathode electrode of the EST, MCT, or SI thyristor. These polarities are opposite to those of the first main semiconductor element of the first feature. On the other hand, the polarities of the second main semiconductor element are the same as those of the second main semiconductor element of the first feature. The third main electrode is the emitter electrode of the IGBT, the source electrode of the MOS transistor, or the cathode electrode of then EST, MCT, or SI thyristor. The fourth main electrode is the collector electrode of the IGBT, the drain electrode of the MOS transistor or the anode electrode of the EST, MCT, or SI thyristor. When energized, the first control electrode is grounded through a resistor. When the ungrounded side of the AC power source increases to be positive, the potential of the control electrode of the first main semiconductor element decreases with respect to the potential of the first main electrode, and therefore, the n-channel first main semiconductor element is unable to turn on. Accordingly, the second feature connects the first control electrode to the first driver that is stepped up by the charge pump, thereby increasing the potential of the first control electrode with respect to the potential of the second main electrode. This turns on the first main semiconductor element When energized, the second control electrode is grounded through a resistor, and the potential of the control electrode of the second main semiconductor element decreases with respect to the potential of the third main electrode. As a result, the n-channel second main semiconductor element is in the nonconducting state. Even so, the second main semiconductor element contains the second parasitic diode, which passes a current from the ungrounded side of the AC power source through the first and second main semiconductor elements and the load and to the ground. When the ungrounded side of the AC power source decreases to be negative, a current reversely flows through the second main semiconductor element that is ON and the first parasitic diode.

A third feature of the present invention provides an AC semiconductor active fuse having a p-channel first main semiconductor element, an n-channel second main semiconductor element, a first reference semiconductor element, and a second reference semiconductor element. The first main semiconductor element has a first main electrode connected to an ungrounded side of the AC power source, a second main electrode opposing to the first main electrode, and a first control electrode for controlling a main current flowing between the first and second main electrodes. The first main semiconductor element contains a first parasitic diode whose cathode region is connected to the first main electrode and whose anode region is connected to the second main electrode. The second main semiconductor element has a third main electrode connected to the second main electrode, a fourth main electrode opposing to the third main electrode and connected to a load, and a second control electrode for controlling a main current flowing between the third and fourth main electrodes. The second main semiconductor element contains a second parasitic diode whose anode region is connected to the third main electrode and whose cathode region is connected to the fourth main electrode. The first reference semiconductor element has a fifth main electrode connected to the first main electrode, a third control electrode connected to the first control electrode, and a sixth main electrode. The second reference semiconductor element has a seventh main electrode connected to the third main electrode, a fourth control electrode connected to the second control electrode, and an eighth main electrode. The AC semiconductor active fuse further has a first comparator for comparing voltages of the second and sixth main electrodes with each other, and a second comparator for comparing voltages of the fourth and eighth main electrodes with each other.

The first and second main semiconductor elements are each a semiconductor element for controlling a main current flowing through a power supply cable. The first reference semiconductor element, first comparator, etc., form a first control circuit for detecting an abnormal current flowing through load of the first main semiconductor element and turning on and off the first main semiconductor element in response to the detected abnormal current, to cause current oscillations that turn off the first main semiconductor element. More precisely, the first control circuit is a first control voltage supply circuit for providing a control voltage to the first and third control electrodes in response to the output of the first comparator. The first main semiconductor element and the first control circuit can form a power IC. The second reference semiconductor element, second comparator, etc., form a second control circuit for detecting an abnormal current flowing through load of the second main semiconductor element and turning on and off the second main semiconductor element accordingly. Upon detecting an abnormal current, the second control circuit turns on and off the second main semiconductor element to cause current oscillations, which turn off the second main semiconductor element. The second control circuit is a second control voltage supply circuit that supplies a control voltage to the second and fourth control electrodes in response to the output of the second comparator. The second main semiconductor element and the second control circuit can form a power IC. That is, the first and second main semiconductor elements and the first and second control circuits could be merged on a single semiconductor chip to form a power IC.

To produce current oscillations to make the first and second main semiconductor elements nonconducting state, or current blocking state so as to break a main current flowing through a power supply cable, a temperature sensor is disposed around the first and second main semiconductor elements. The temperature sensor detects a temperature increase promoted by current oscillations and turns off the first and second main semiconductor elements. Alternatively, the number of current oscillations may be counted, and when the counted number reaches a predetermined value, the first and second main semiconductor elements are turned off to block a main current flowing through a power supply cable. A simplest way to count the number of current oscillations is to measure charge accumulated at a capacitor, i.e, a terminal voltage of the capacitor.

The AC semiconductor active fuse of the third feature is capable of detecting an overcurrent without a shunt resistor, which was connected in series with a conventional power supply cable. Accordingly, the third feature reduces heat dissipation and a conduction loss. The third feature is capable of simply and speedily detecting not only an overcurrent caused by a dead short but also an abnormal current caused by an incomplete short circuit failure having a certain extent of short-circuit resistance, and cutting a main current flowing through a power supply cable. In addition, the third feature is capable of detecting and controlling an overcurrent in a power supply cable without a microcomputer, thereby greatly reducing the size and cost of the power supply system. The third feature employs no classical metallic fuse, which melts when current exceeds specific amperage so as to open the circuit, reducing the size and weight of a power supply system. The third feature eliminates labor for replacing blown fuses from the power supply system.

According to the third feature, a terminal voltage between the first and second main electrodes of the first main semiconductor element has an OFF-to-ON voltage characteristic curve (a fall characteristic curve) that is dependent on the conditions of a power supply cable and load. Similarly, the fall characteristic curve of a terminal voltage between the third and fourth electrodes of the second main semiconductor element is dependent on the conditions of the power supply cable and load. Depending on the wiring inductance of the power supply cable and a time constant determined by wiring resistance or short-circuit resistance, the fall characteristic curves change. For example, the fall characteristic curves quickly converge below a predetermined voltage under a normal state having no short circuit failure in the power supply cable. If a dead short occurs in the power supply cable, the fall characteristic curves never converge under the predetermined voltage. If there is an incomplete short circuit failure having a certain extent of short-circuit resistance in the power supply cable, the fall characteristic curves take a long time to converge below the predetermined voltage. The AC semiconductor active fuse of the third feature uses such voltage characteristics of semiconductor elements in an OFF-to-ON transient period. Namely, the third feature detects the difference between a terminal voltage of the first main semiconductor element and a reference terminal voltage of the first reference semiconductor element, or the difference between a terminal voltage of the second main semiconductor element and a reference terminal voltage of the second reference semiconductor element, and determines a deviation of the terminal voltage (i.e., a current in the power supply cable) of the first or second main semiconductor element that is inserted in the power supply cable, from a voltage corresponding to a normal state. By connecting a plurality of first and second main semiconductor elements in parallel according to their rated currents, it is possible to handle a large current. To detect a weak current, a voltage corresponding to the weak current is set in the AC Semiconductor active fuse of the third feature. The third feature is capable of optionally setting a breaking speed with respect to an incomplete short circuit failure. Unlike the already mentioned related art that detects an overcurrent by comparison with a threshold at set timing, the third feature detects an overcurrent according to a change in the transient characteristics of a terminal voltage of the first or second main semiconductor element, so that the third feature may eliminate some parts such as capacitors and resistors, thereby minimizing detection errors caused by parts variations. In addition, the third feature eliminates an external capacitor from a semiconductor chip on which the AC semiconductor active fuse is packaged, thereby greatly reducing the size and cost of the semiconductor active fuse.

The AC semiconductor active fuse of the third feature detects a current without a shunt resistor, which was connected in series with a conventional power supply cable. Accordingly, the third feature minimizes heat dissipation and effectively uses electric energy. Unlike the classical passive fuse, the semiconductor active fuse of the third feature is capable of handling not only an overcurrent caused by a dead short but also an abnormal current caused by an incomplete short circuit failure having a certain extent of short-circuit resistance. Further, the third feature needs no microcomputer for controlling ON/OFF operations. The third feature employs a simple hardware circuit for controlling ON/OFF operations. The AC semiconductor active fuse of the third feature needs a small packaging space and greatly reduces the cost of at AC power system.

According to the third feature, the first main semiconductor element may be composed of N1 first unit cells and the first reference semiconductor element of N2 first unit cells with N1>>N2. Also, the second main semiconductor element may be composed of N3 second unit cells and the second reference semiconductor element of N4 second unit cells with N3>>N4. Namely, each of the first and second main semiconductor elements are a power element composed of unit cells connected in parallel with one another, to realize a multi-channel structure to provide a rated current handling capability. The current handling capability of each of the first and second reference semiconductor elements is set to be smaller than that of the corresponding main semiconductor element by adjusting the number of parallel-connected unit cells that form the main and reference semiconductor elements The numbers N1 and N2 of unit cells determine a current dividing ratio of N1:N2. And the numbers N3 and N4 of unit cells determine a current dividing ratio of N3:N4 For example, N2=1, and N1=1000. In this case, the ratio of the channel width of the first reference semiconductor element to that of the first main semiconductor element is 1:1000, and a current dividing ratio is determined accordingly. By making the circuit configurations in this way, the sizes of reference semiconductor elements are minimized, to reduce the size and cost of a semiconductor chip on which the first and second semiconductor active fuses of the third feature are merged.

According to the third feature, the first main semiconductor element, first reference semiconductor element, second main semiconductor element, second reference semiconductor element first comparator, second comparator, and other related elements of the AC semiconductor active fuse may monolithically be integrated on a single semiconductor substrate, to reduce a packaging space. This enables the semiconductor active fuse to be mass-produced, to reduce the cost thereof. Alternatively, the first main and reference semiconductor elements and second main and reference semiconductor elements may be integrated into "a power chip", and the first and second comparators and other related elements may be integrated into "a control chip", to form a multi-chip module (MCM) or a hybrid IC of compact size.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 3A is a cross sectional view showing an nMOS transistor serving as a reverse-conducting semiconductor element;

DESCRIPTION OF THE PREFERRED EMBODIMENTS

Figure 1:
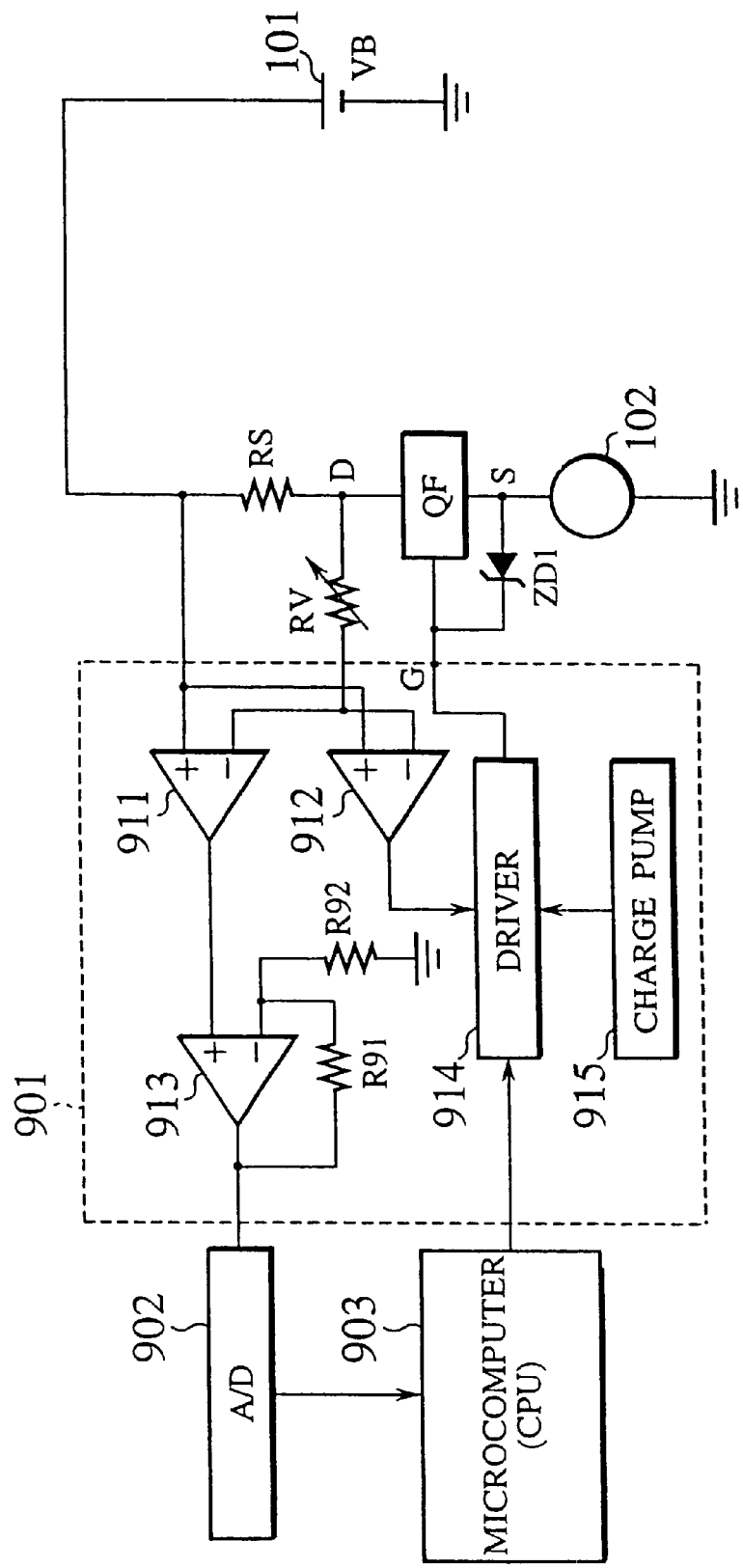
FIG. 1 is a circuit diagram showing a direct current supply/control apparatus according to a related art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor device s, it will be appreciated that the various drawings are not drawn to scale from one figure to another nor inside a given figure, and in particular, that the layer thicknesses are arbitrarily drawn for facilitating the reading of the drawings. In the following descriptions, numerous specific details are set fourth such as specific signal values, etc., to provide a thorough understanding of the present invention. However, it will be obvious to those skilled in the art that the present invention may be practiced without such specific details. In other instances, well-known circuits have been shown in block diagram forms in order not to obscure the present invention in unnecessary detail.

(EQUIVALENT CIRCUIT OF BIDIRECTIONAL SWITCHING DEVICE)

Figure 2:
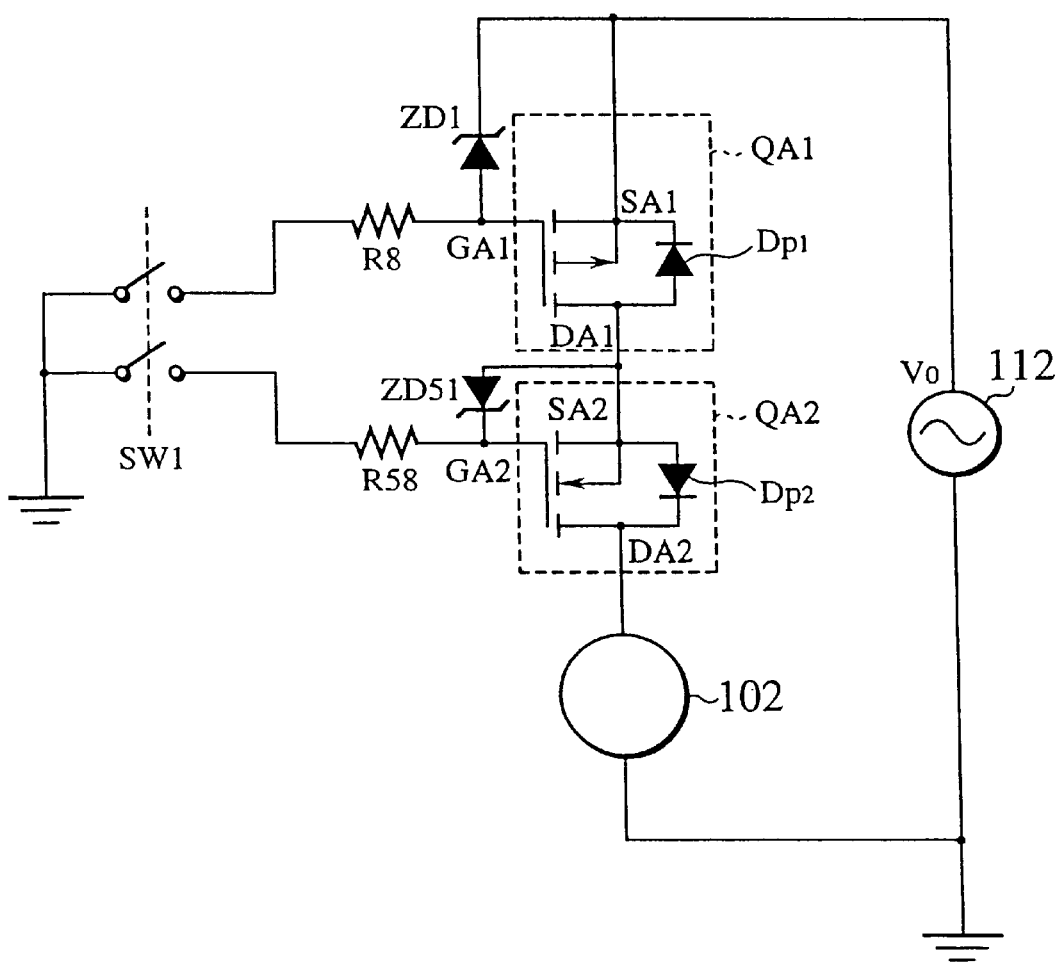
FIG. 2 is an equivalent circuit diagram showing a bidirectional switching device according to an embodiment of the present invention.

FIG. 2 shows a bidirectional switching device according to an embodiment of the present invention. The bidirectional switching device has a p-channel first main semiconductor element QA1 and an n-channel second main semiconductor element QA2. The first main semiconductor element QA1 has a first main electrode SA1 connected to an ungrounded side of an AC power source 112, a second main electrode DA1 opposing to the first main electrode SA1, and a first control electrode GA1 for controlling a main current flowing between the first and second main electrodes SA1 and DA1. The first main semiconductor element QA1 contains a first parasitic diode $D_{p1}$ whose cathode region is connected to the first main electrode SA1 and whose anode region is connected to the second main electrode DA1. The second main semiconductor element QA2 has a third main electrode SA2 connected to the second main electrode DA1, a fourth main electrode DA2 opposing to the third main electrode SA2 and connected to a load 102, and a second control electrode GA2 for controlling a main current flowing between the third and fourth main electrodes SA2 and DA2. The second main semiconductor element QA2 contains a second parasitic diode $D_{p2}$ whose anode region is connected to the third main electrode SA2 and whose cathode region is connected to the fourth main electrode DA2.

Exemplary, the first main semiconductor element QA1 is a pMOS transistor, and the second main semiconductor element QA2 an nMOS transistor. The elements QA1 and QA2 are each a reverse-conducting semiconductor element. Namely the drain electrode DA1 of the pMOS transistor QA1 is connected to the source electrode SA2 of the nMOS transistor QA2. The drain electrode DA2 of the nMOS transistor QA2 is connected to a grounded side of the AC power source 112 through the load 102. The ungrounded side of the power source 112 is connected to the source electrode SA1 of the pMOS transistor QA1. The load 102 is connected between the ground GND and the drain electrode DA2 of the nMOS transistor QA2.

A Zener diode ZD1 keeps a predetermined voltage of, for example, 12 V between the first control electrode (gate electrode) GA1 and source electrode SA1 of the pMOS transistor QA1, to bypass an overvoltage so that the overvoltage may not be applied to a gate insulation film of the pMOS transistor QA1. A Zener diode ZD51 keeps a voltage of 12 V between the second control electrode (gate electrode) GA2 and source electrode SA2 of the nMOS transistor QA2, to bypass an overvoltage so that the overvoltage may not be applied to a gate insulation film of the nMOS transistor QA2. The first control electrode (first gate electrode) GA1 is connected to a resistor R8, which produces a potential difference between the first gate electrode GA1 and the ground. The second control electrode (second gate electrode) GA2 is connected to a resistor R58, which produces a potential difference between the second gate electrode GA2 and the ground. When a switch SW1 is closed, the bidirectional switching device of the present invention is energized, and when the switch SW1 is opened, the bidirectional switching device is de-energized.

An alternating-current path to be formed when the switch SW1 is closed will be explained. When potential at the source electrode SA1 of the pMOS transistor QA1 is positive, the pMOS transistor QA1 turns on. At this time, the nMOS transistor QA2 is in the nonconducting state. Accordingly, a current flows from the source electrode SA1 to the drain electrode DA1 of the pMOS transistor QA1 and passes through the second parasitic diode $D_{P2}$ that is present between the source electrode SA2 and drain electrode DA2 of the nMOS transistor QA2.

When the potential at the source electrode SA1 of the pMOS transistor QA1 becomes negative, the pMOS transistor QA1 turns off, and the nMOS transistor QA2 conducts, As a result, a current flows from the drain electrode DA2 to the source electrode SA2 of the nMOS transistor QA2 and reversely passes through the first parasitic diode $D_{P1}$ that is present between the source electrode SA1 and drain electrode DA1 of the pMOS transistor QA1.

(PARASITIC DIODE OF DMOS)

FIG. 3A is a cross sectional view showing a unit cell of a nMOS transistor. This is an example of a transistor serving as the second main semiconductor element QA2 of FIG. 2. In practice, a plurality of such unit cells are arranged in parallel on a semiconductor chip. For example, the number of unit cells is 1000 to realize a rated current handling capability.

In FIG. 3A, the unit cell of the nMOS transistor has an $n^+$ region 308 serving as a drain region. On the drain region 308, an $n^+$ region 307 serving as a drift region is epitaxially grown. On the surface of the drift region 307, two island-like p-body regions 306 are formed, facing to each other. The two p-body regions 306 may be connected to each other behind FIG. 3A. For example, the p-body regions 306 may form a circular or rectangular ring shape in a plan view. On each of the p-body regions 306, an $n^+$ region 805 serving as a source region is formed. The source regions 305 may be a continuous diffusion region having the circular or rectangular ring shape. On the p-body regions 306 and drift region 307, a gate insulation film 304 is formed. On the gate insulation film 304, a gate electrode 303 serving as the second control electrode GA2 is formed. On the gate electrode 303, an interlayer insulation film 302 is formed. The insulation film 302 has a contact hole through which a source electrode 301 serving as the third main electrode SA2 short-circuits the p-body regions 306 and source regions 305 to each other. On the bottom surface of the drain region 308, a drain electrode 309 serving as the fourth main electrode DA2 is formed.

In the DMOS structure of FIG. 3A, a special attention must be given to the second parasitic diode $D_{P2}$ having a p-n junction structure between the p-body regions 306 and the $n^-$ drift region 307, or between the p-body regions 306 and the $n^+$ drain region 308. When, contrary to a forward bias condition to operate the DMOS, the fourth main electrode (drain) 309 is set to be negative and the third main electrode (source) 301 to be positive, the second parasitic diode $D_{P2}$ is made to be conductive so as to establish a reverse-conducting state.

Figure 6A:
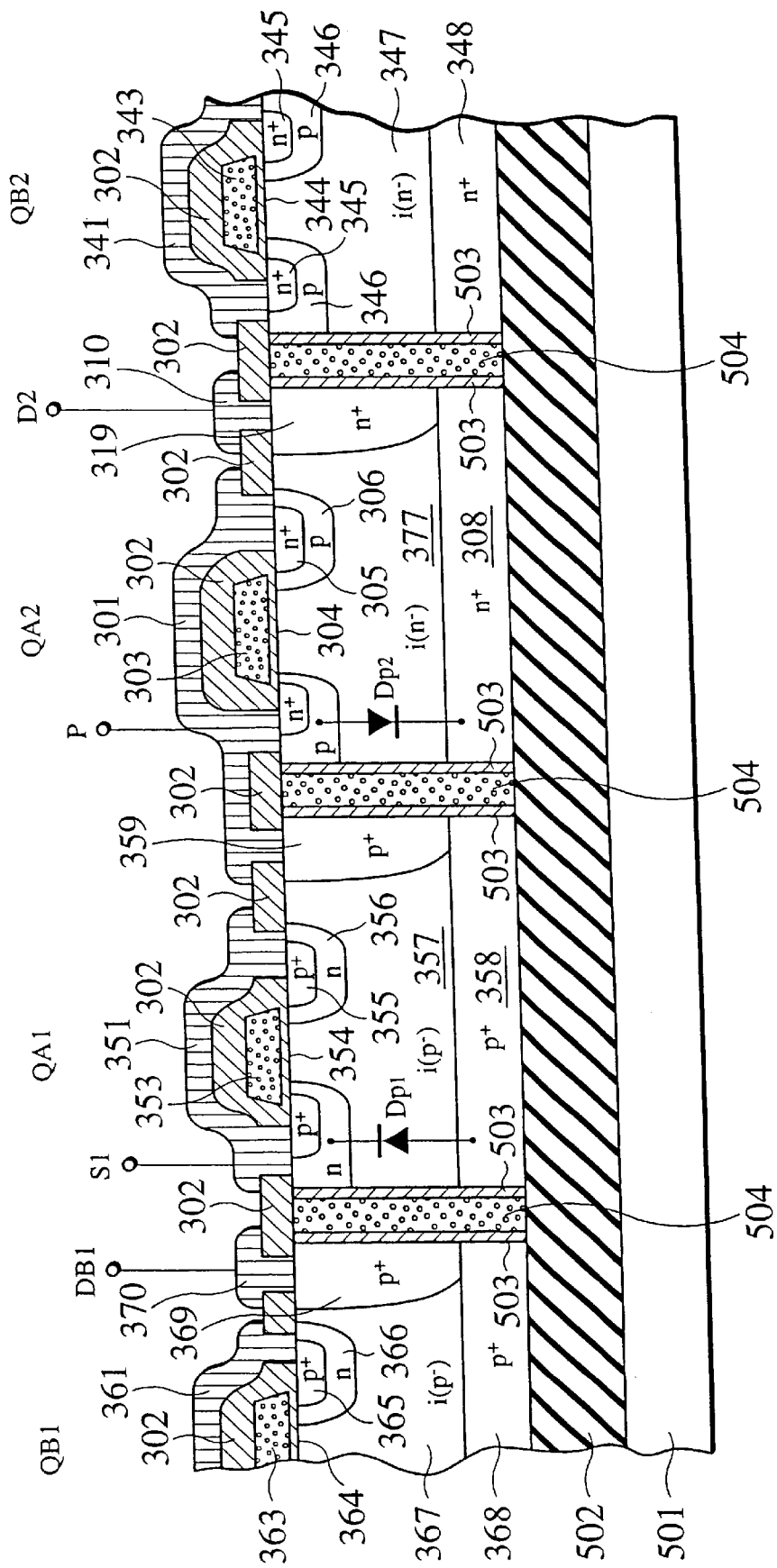
FIG. 6A is a cross sectional view showing a part of a monolithic structure that realizes the bidirectional switching device of FIG. 4.
Figure 6B:
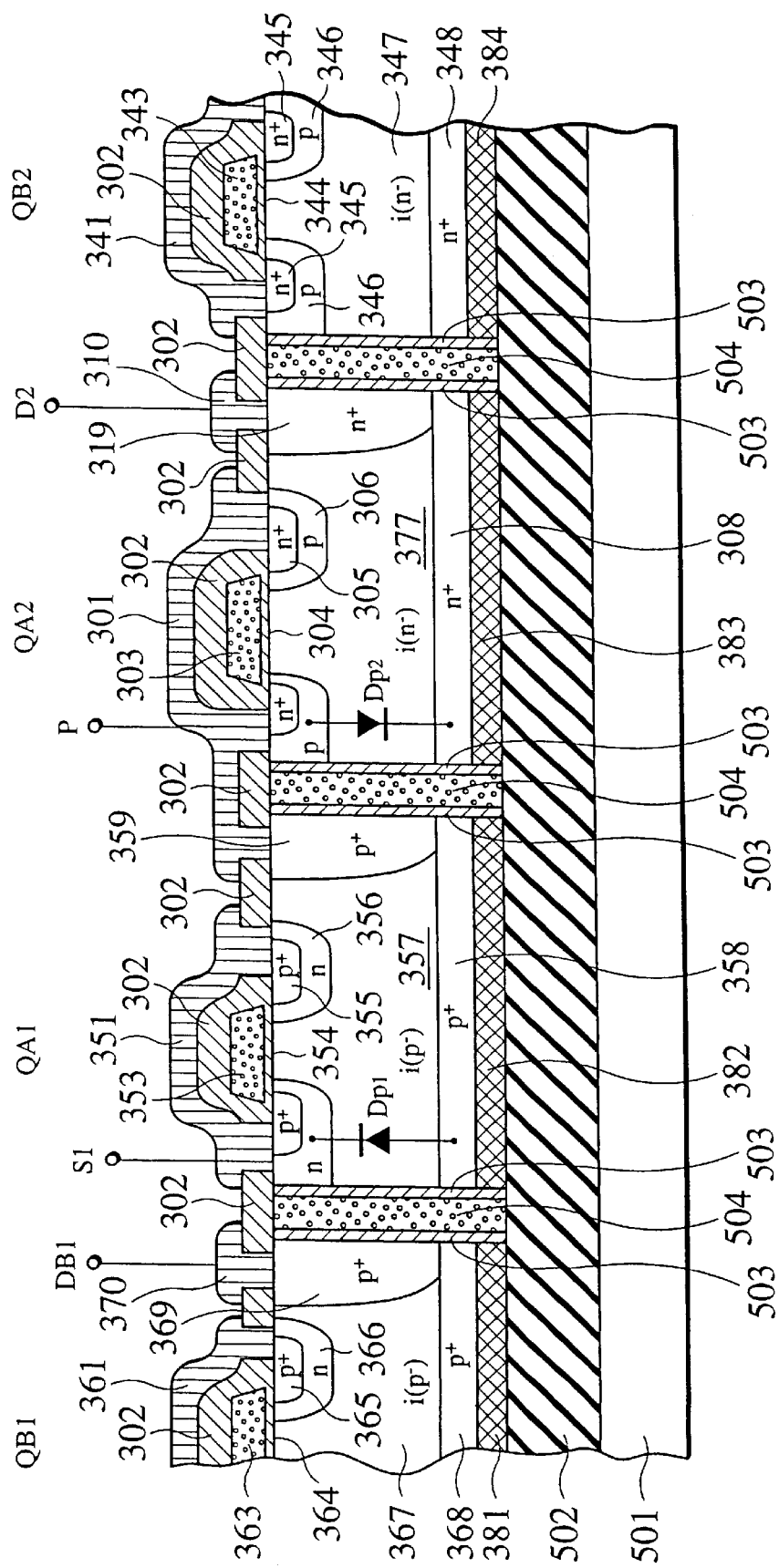
FIG. 6B is a cross sectional view showing a part of another monolithic structure that realizes the bidirectional switching device of FIG. 4.

The present invention positively uses the second parasitic diode $D_{P2}$ as a reverse current path as shown in FIG. 2. Similarly, there is the first parasitic diode $D_{P1}$ in a p-channel DMOS structure as shown in FIGS. 6A and 6B. The first parasitic diode $D_{P1}$ has opposite polarities to the second parasitic diode $D_{P2}$ and is similarly formed with the conductivity types p and n being opposite to those of FIG. 3A. The first and second parasitic diodes $D_{P1}$ and $D_{r2}$ are formed in large areas over the bottoms of semiconductor chips, to have low ON resistance and minimize a conduction loss.

(PARASITIC DIODE OF IGBT)

Figure 3B:
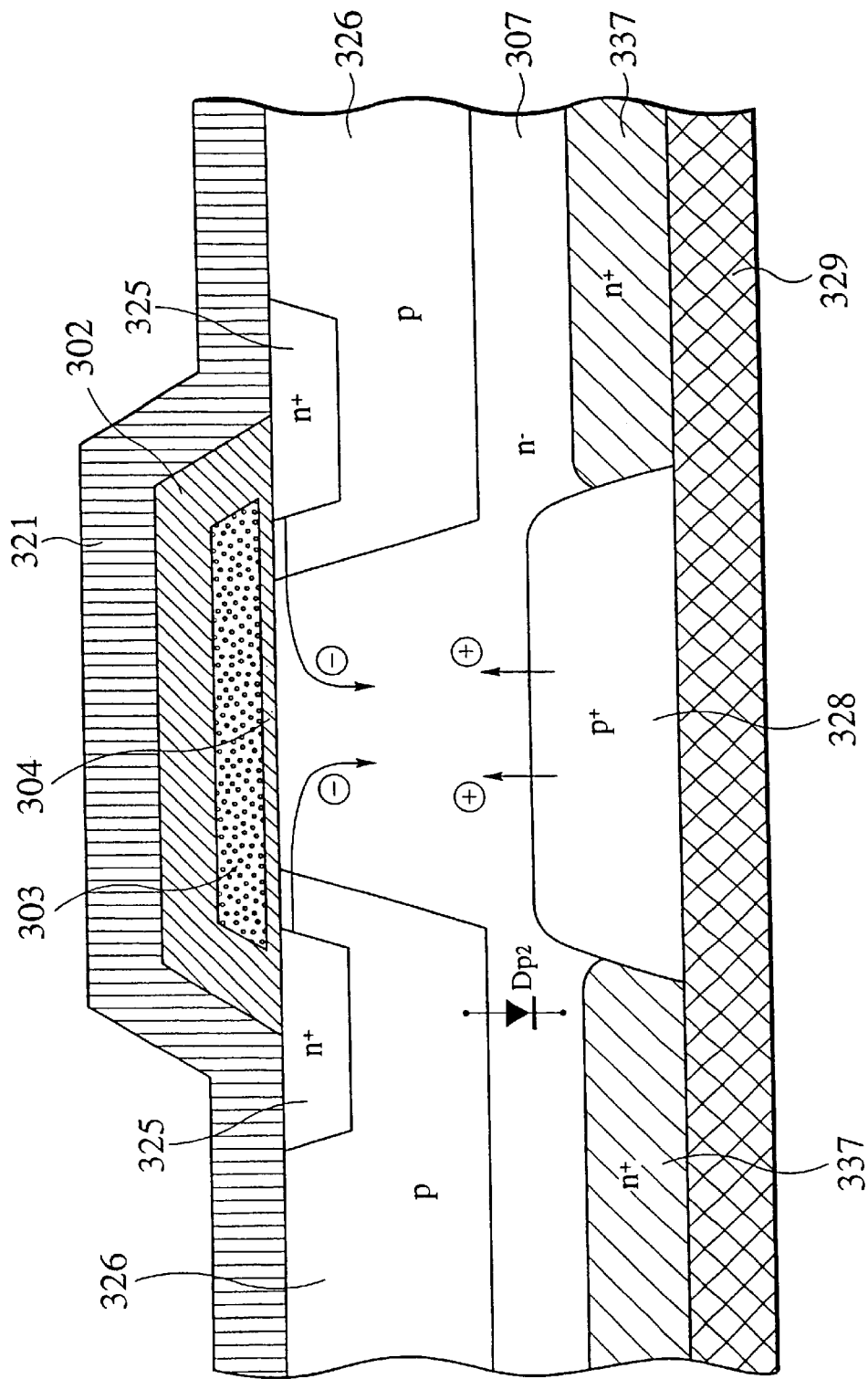
FIG. 3B is a cross sectional view showing a collector-short IGBT serving as another reverse -conducting semiconductor element.

FIG. 3B is a cross sectional view showing a unit cell of a collector-short IGBT that may serve as the second main semiconductor element QA2 of FIG. 2. In practice, a plurality of such unit cells of the IGBT are arranged in parallel on a semiconductor chip, to implement a large current handling capability. The unit cell of the IGBT of FIG. 3B has a collector electrode (fourth main electrode) 329 on which a $p^+$ region 328 serving as a collector region and an $n^+$ short region 337 are alternated, to form a collector short structure. On the collector region 328 and short region 337, an $n^-$ region 307 serving as a drift region is formed. On the surface of the drift region 307, two island-like p-base regions 326 are formed facing to each other. The two p-base regions 326 may be connected to each other behind FIG. 3B. Namely the p-base regions 326 may form a circular or rectangular ring shape in a plan view. On the surfaces of the p-base regions 326, $n^+$ regions 325 serving as emitter regions are formed. The emitter regions 325 may also be continuous to each other to form the circular or rectangular ring shape. On the p-base regions 326 and drift region 307, a gate insulation film 304 is formed. On the gate insulation film 304, a gate electrode (second control electrode) 303 is formed. On the gate electrode 303, an interlayer insulation film 302 is formed. The insulation film 302 has a contact hole through which an emitter electrode (third main electrode) 321 short-circuits the p-base regions 326 and emitter regions 325 to each other When the IGBT is turned on, the drift region 307 at the boundary to the collector region 328 accumulates electrons. The electrons accelerate the injection of holes from the collector region 328, so that the drift region 307 hold two carriers, i.e., the electrons and holes to cause conductivity modulation. It is possible to thicken the drift region 307 while lowering ON resistance, to realize a device having a high blocking voltage and low ON resistance. In the IGBT, however, the electrons accumulated in the drift region 307 in front of the collector region 328 continuously provide a tail current when the IGBT is turned off, until the accumulated electrons disappear due to recombination. This prevents a high-speed turn-off operation. The collector short structure of FIG. 3B is capable of drawing, through the n+ short region 337, the electrons accumulated in the drift region 307 in front of the collector region 328, thereby suppressing the tail current at a turn-off operation and realizing a high-speed operation.

Like the DMOS transistor of FIG. 3A, the collector short IGBT of FIG. 3B contains a second parasitic diode ($D_{P2}$) of p-n junction structure between the p-base regions 326 and the drift region 307, or between the p-base regions 326 and the n+ short region 337. Then, contrary to a forward bias condition for operating the collector short IGBT, if a reverse bias condition is set to make the collector electrode 329 negative and the emitter electrode 321 positive, the parasitic diode $D_{P2}$ becomes conductive to cause a reverse-conducting state. Similarly, a p-channel collector short IGBT (not shown) contains a first parasitic diode ($D_{P1}$). The present invention positively uses the first and second parasitic diodes $D_{P1}$ and $D_{P2}$ as the reverse current paths of the bidirectional switching device, to speedily cut a high voltage.

(PACKAGE STRUCTURE)

Figure 4:
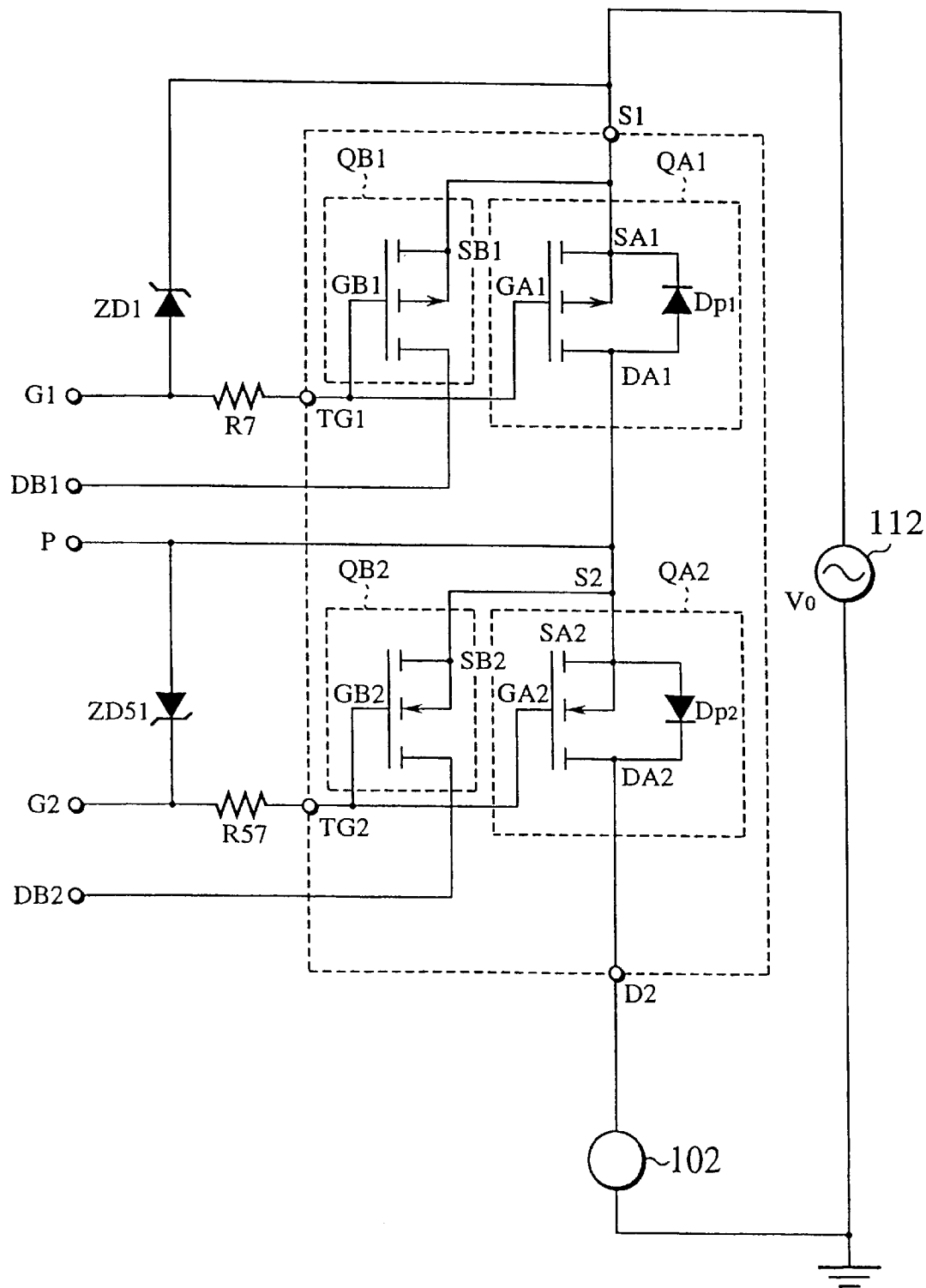
FIG. 4 is an equivalent circuit diagram showing a bidirectional switching device according to another embodiment of the present invention.

FIG. 4 is an equivalent circuit diagram showing a bidirectional switching device according to another embodiment of the present invention. This device involves a first reference semiconductor element (pMOS transistor) QB1 and a second reference semiconductor element (nMOS transistor) QB2 in addition to the arrangement of FIG. 2. The first reference semiconductor element QB1 is arranged in parallel with a first main semiconductor element (pMOS transistor) QA1, and the second reference semiconductor element QB2 is connected in parallel with a second main semiconductor element (nMOS transistor) QA2.

The first reference semiconductor element QB1 has a fifth main electrode (source electrode) SB1 connected to the first main electrode (source electrode) SA1 of the first main semiconductor element QA1, a third control electrode (third gate electrode) GB1 connected to the first control electrode (first gate electrode) GA1 of the first main semiconductor element QA1, and a sixth main electrode (drain electrode) DB1. The second reference semiconductor element QB2 has a seventh main electrode (source electrode) SB2 connected to the third main electrode (source electrode) SA2 of the second main semiconductor element QA2, a fourth control electrode (fourth gate electrode) GB2 connected to the second control electrode (second gate electrode) GA2 of the second main semiconductor element QA2, and an eighth main electrode (drain electrode) DB2. The first main electrode SA1 of the first main semiconductor element QA1 is connected to an ungrounded side of an AC power source 112, and the fourth main electrode DA2 of the second main semiconductor element QA2 is connected to a load 102.

A Zener diode ZD1 keeps a predetermined voltage of, for example, 12 V between the first gate electrode (first control electrode) GA1 and first main electrode (source electrode) SA1 of the first main semiconductor element (pMOS transistor) QA1, to bypass an overvoltage so that the overvoltage may not be applied to a gate insulation film of the pMOS transistor QA1 Similarly, a Zener diode ZD51 keeps a voltage of 12 V between the second gate electrode (second control electrode) GA2 and third main electrode (source electrode) SA2 of the second main semiconductor element (nMOS transistor) QA2, to bypass an overvoltage so that the overvoltage may not be applied to a gate insulation film of the nMOS transistor QA2. The first control electrode (first gate electrode) GA1 is connected to a resistor R7, and the second control electrode (second gate electrode) GA2 is connected to a resistor R57.

Figure 5A:
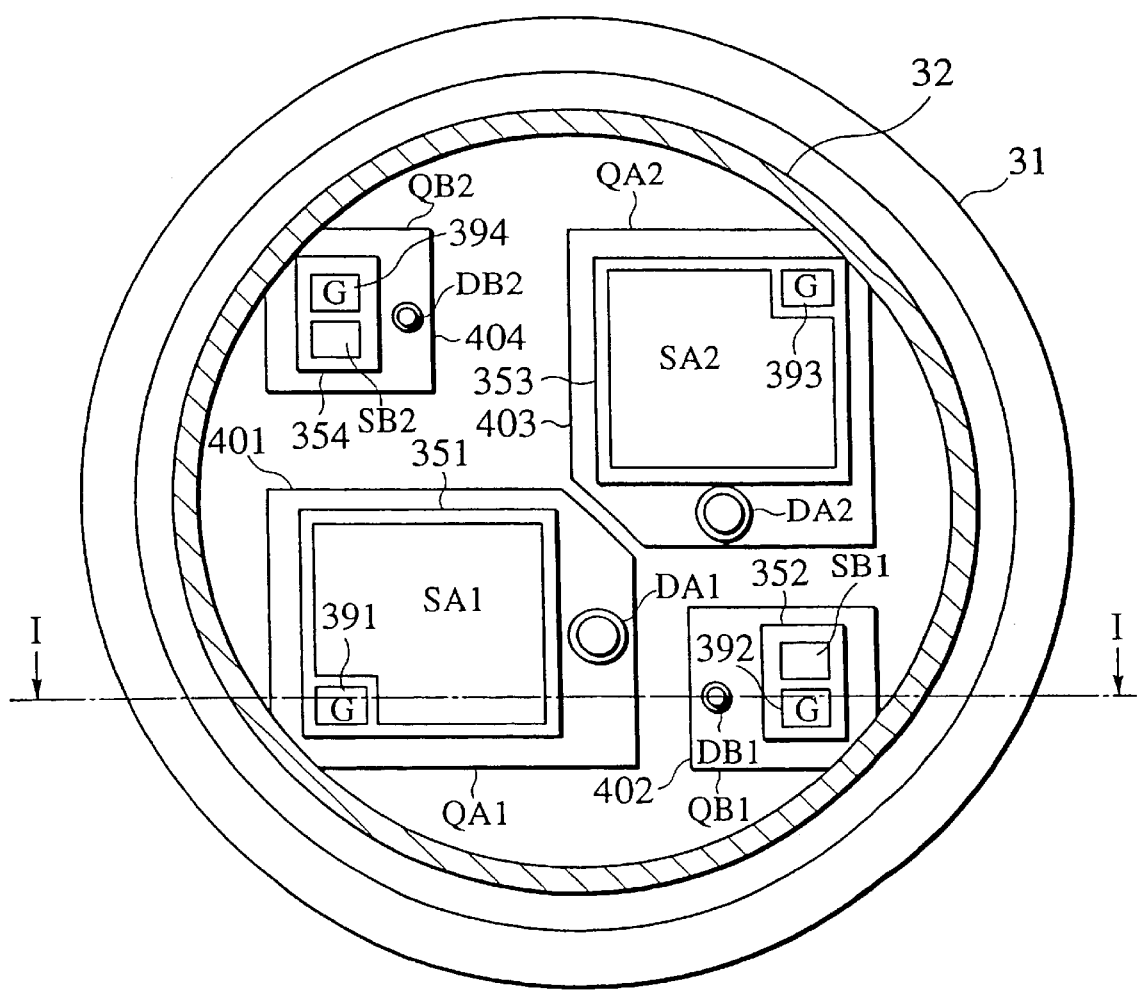
FIG. 5A is a plan view showing a large-current control module that realizes the bidirectional switching device of FIG. 4.
Figure 5B:
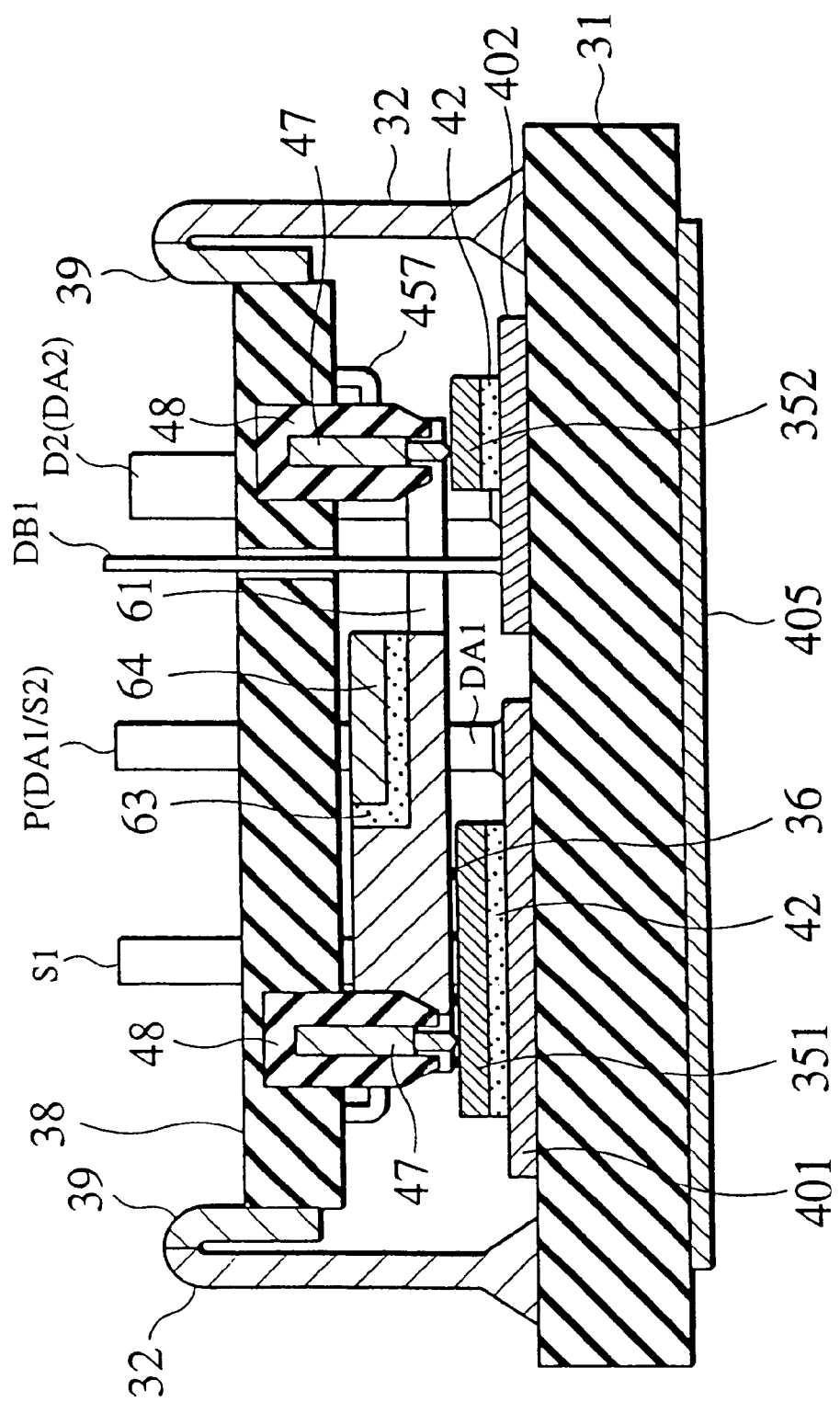
FIG. 5B is a cross sectional view taken along a line I—I of FIG. 5A.

FIG. 5A is a plan view showing a large current controlling module (package) for realizing the circuit configuration of FIG. 4, and FIG. 5B is a cross sectional view taken along a line I—I of FIG. 5A. This module is capable of breaking an alternating current of several hundreds of amperes to about 1000 amperes upon detecting an abnormal current. The module of FIG. 5A serves as the bidirectional switching device of FIG. 4. The module has MOS transistors serving as the first main semiconductor element QA1, first reference semiconductor element QB1, second main semiconductor element QA2, and second reference semiconductor element QB2 formed on four semiconductor chips 351 to 354, which are mounted on a ceramic base 31. The periphery of the base 31 is surrounded with a circular metal flange 32 having a low thermal expansion coefficient. The semiconductor chips 351 to 354 have source electrode pads SA1, SA2, SB1 and SB2 serving as the first, third, fifth, and seventh main electrodes, and gate electrode pads 391 to 394 serving as the first to fourth control electrodes, The top surface of the ceramic base 31 has copper plates 401 to 404 that are electrically isolated from one another. The bottom surface of the base 31 has a copper plate 405 as shown in FIG. 5B. The copper plates 401 to 404 are joined with the base 31 by direct sintering or by silver or aluminum brazing. The flange 32 is joined with the top surface of the base 31 around the copper plates 401 to 404 by direct sintering or brazing. The brazing employed here is active metal brazing using surface catalyzer such as titanium (Ti), to provide the joints between the ceramic base 31, copper plates 401 to 404, and flange 32 with proper mechanical strength. When brazing is used, each joint interface among the base 31, copper plates 401 to 405, and flange 32 has a brazing layer of two to several micrometers thick. Such brazing layers are not shown in FIGS. 5A and 5B.

The semiconductor chips 351 to 354 are soldered to the copper plates 401 to 404 through solder layers 42 of about 100 micrometers thick. The chip 351 has the first main semiconductor element QA1 having the source electrode pad SA1 on the main surface of the chip 351. On the main surface of the chip 351, there are conductive contacts 36 made of highly conductive semispherical metal parts, solder balls, or silver bumps. On the contacts 36, a first chip presser 61 made of molybdenum (Mo) is pressed with a spring. Similarly, the semiconductor chip 352 has the first reference semiconductor element QB1 having the source electrode pad SB1 on the main surface of the chip 352. On the main surface of the chip 352, there are contacts 36 on which the first chip presser 61 is pushed down with the spring. Behind FIG. 5B, the second main semiconductor element QA2 and second reference semiconductor element QB2 are mounted on the semiconductor chips 353 and 354, respectively, in the similar manner (See FIG. 5A). The first chip presser 61 is mechanically connected to a backbone 64 through an insulator 63 as shown in the perspective view of FIG. 5C. A second chip presser 62 is directly connected to the backbone. 64, to pass a predetermined current.

In this way, the first and second chip pressers 61 and 62 press the source electrode pads SA1, SA2, SB1, and SB2 of the four semiconductor chips 351 to 354, to form source electrode paths. As shown in FIG. 5B, an annular member 39 made of metal having a low thermal expansion coefficient is joined with the periphery of a ceramic housing 38 with, for example, silver brazing. The top of the annular member 39 is welded to a top end of the flange 32. A probe pin 47 is pressed by a spring (not shown) through an insulator 48 toward each of the gate electrode pads 391 to 394 of the MOS transistors formed on the main surfaces of the semiconductor chips 351 to 354.

Figure 5C:
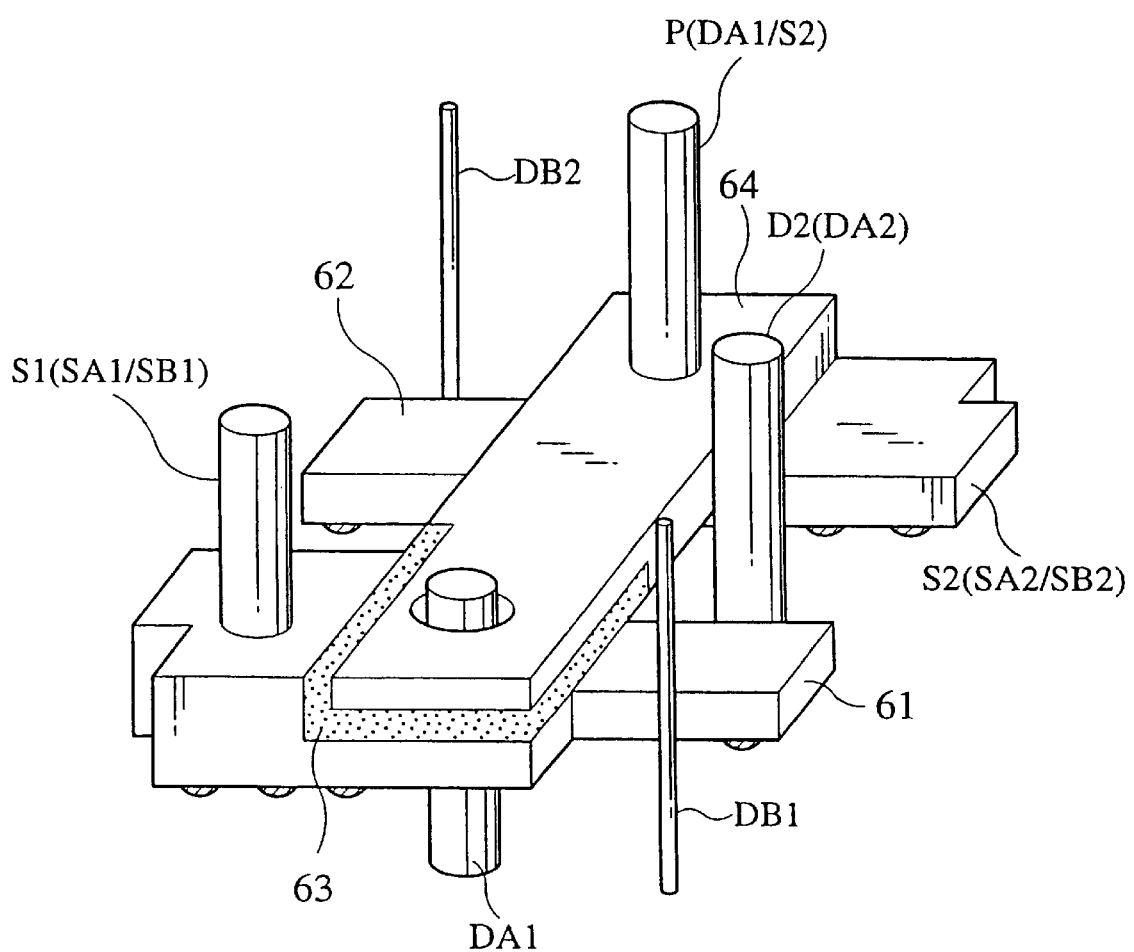
FIG. 5C is a perspective view showing the structure of a source electrode lead employed by the large-current control module.

In FIG. 5B, the bottoms of the chips 351 to 354 serving as drain electrodes are soldered to the copper plates 401 to 404, respectively, and therefore, the copper plates 401 to 404 serve as drain electrode wiring parts for the MOS transistors. Relatively thin cylindrical copper leads are welded to the copper plates 401 to 404. The cylindrical copper leads serve as the drain electrodes DA1, DA2, DB1, and DB2, i.e., the second, fourth, sixth, and eighth electrodes. In FIG. 5C, the drain electrode (cylindrical copper lead) DA1 passes through the backbone 64 and is welded to the top of the backbone 64. The drain electrodes (cylindrical copper leads) DA2, DB1, and DB2 pass through the ceramic housing 38 and protrude to the outside. An intermediate terminal P made of a columnar copper bar extends from the top of the backbone 64, passes through the ceramic housing 38, and protrudes to the outside. A columnar source lead extension SA1 made of a copper rod extends from the top of the first chip presser 61, passes through the ceramic housing 38, and protrudes to the outside. The drain electrodes DA2, DB1, and DB2 are joined with copper caps by caulking. The copper caps are brazed to the ceramic housing 38 with silver or aluminum. Similarly, the source electrode SA1 is joined with a copper cap by caulking. This copper cap is brazed to the ceramic housing 38 with silver or aluminum. The probe pins are connected to gate bonding pads, which are joined with copper caps by caulking. These copper caps are brazed to the ceramic housing 38.

As shown in FIG. 5B, the lower end of the flange 32 is brazed to the ceramic base 31, and the upper end of the flange 32 is joined with the ceramic housing 38 through the metal member 39 that is welded to the top end of the flange 32. This structure defines a hermetic space. In addition, via holes through which the drain electrodes DA2, DB1, and DB2, the source electrode SA1, and the gate probe cables connected to gate bonding pads, protruding to outside of the ceramic housing 38, are hermetically closed with the caps. This structure improves moisture resistance and completely prevents moisture and corrosive gas from entering the package, thereby preventing the semiconductor chips 351 to 354 from malfunctioning. Consequently, this structure improves the reliability of the bidirectional switching device.

The source electrode pads SA1, SA2, SB1, and SB2 of the semiconductor chips 351 to 354 are pressed by the first and second chip pressers 61 and 62 through the contacts 36 without bonding wires such as aluminum wires. The drain electrode layers on the bottom surfaces of the semiconductor chips 351 to 354 are soldered to the copper plates 401 to 404. This structure secures a large current handling capability for each electrode path, and therefore, the bidirectional switching device of the present invention employing this structure shows a great power-cycle-immunity.

(INTEGRATED STRUCTURE)

FIG. 6A is a cross sectional view showing a monolithically integrated structure that realizes the bidirectional switching device of FIG. 4. This structure is a dielectric isolation (DI) structure based on silicon-on-insulator (SOI) technology. The SOI structure has a base substrate 501 on which an SOI film (buried insulation film) 502 is formed. On the insulation film 502, intrinsic (i-type) semiconductor regions 367, 357, 377, and 347 are formed.

Each of the i-type semiconductor regions 367, 357, 377, and 347 is an island-like structure isolated by the insulation film 502 disposed at the bottom and element isolation regions (503, 504), surrounding the side wall of the i-type semiconductor regions 367, 357, 377, and 347. The semiconductor regions 367, 357, 377, and 347 form the first reference semiconductor element QB1, first main semiconductor element QA1, second main semiconductor element QA2, and second reference semiconductor element QB2, respectively. For example, the semiconductor region 357 forms the first main semiconductor element QA1 consisting of N1 first unit cells, and the semiconductor region 367 forms the first reference semiconductor element QB1 consisting of N2 first unit cells. For the sake of simplicity, each element is represented with a single unit cell. Similarly, the semiconductor region 377 forms the second main semiconductor element QA2 consisting of N3 second unit cells, and the semiconductor region 347 forms the second reference semiconductor element QB2 consisting of N4 second unit cells. Each of these elements is represented with one unit cell in FIG. 6A. The semiconductor regions 367, 357, 377, and 347 may be of $n^+$ type ($\upsilon$ type) or $p^+$ type ($\pi$ type). Namely, the semiconductor regions 367, 357, 377, and 347 may contain a small amount of $p^+$ or n-type dopants in the range of $1\times10^{11}$ cm$^{-3}$ to $5\times10^{12}$ cm$^{-3}$ so that each semiconductor region is substantially of i-type. In the following explanation, the substantially i-type region is called "the i-type semiconductor region". A semiconductor region having an impurity concentration of $5\times10^{12}$ cm$^{-3}$ to $5\times10^{14}$ cm$^{-3}$ is equivalent to an i-type semiconductor region as long as the region is nearly completely depleted during operation.

Each element isolation region consists of a trench that is deep to reach the SOI film (buried insulation film) 502. More precisely, the element isolation region is made of an insulation film 503 formed on the sidewall of the trench and a semi-insulating polysilicon (SIPOS) 504 sandwiched between the insulation films 503. The bottoms of the semiconductor regions 367, 357, 377, and 347 are $p^+$ buried drain region 368, $p^+$ buried drain region 358, $n^+$ buried drain region 308, and $n^+$ buried drain region 848, resprespctively. These buried drain regions 368, 358, 308, and 348 have $p^+$ sinker region 369, $p^+$ sinker region 359, $n^+$ sinker region 319, and $n^+$ sinker region 349, respectively, for guiding the buried drain regions up to the top surface of the semiconductor chip. The first main semiconductor element QA1 is made of N1 (for example, N1=1000) first unit cells formed in the semiconductor region 357, and the second main semiconductor element QA2 is made of N3 second unit cells formed in the semiconductor region 377. The first reference semiconductor element QB1 is made of N2 (for example, N2=1) first unit cell(s) formed in the semiconductor region 367, and the second reference semiconductor element QB2 is made of N4 second unit cell(s) formed in the semiconductor region 347. Accordingly, plural sinker regions 359, 319, etc., may be provided for the unit cells, respectively, Alternatively, the plural unit cells may be grouped, and the sinker regions may be provided for the groups, respectively, to improve the degree of integration on the semiconductor chip. Providing each unit cell with a sinker region may reduce ON resistance. To reduce ON resistance, metal layers 381 to 384 may be formed under the buried drain regions 368, 358, 308, and 348, respectively as shown in FIG. 6B. The buried metal layers 381 to 384 may be made of refractory metal such as tungsten (W), titanium (Ti), and molybdenum (Mo), or a silicide thereof such as $WSi_2$, $TiSi_2$, and $MoSi_2$. Instead, the metal layers 381 to 384 may be made of polycide employing the silicide.

In FIG. 6A, the pMOS transistor serving as the first reference semiconductor element QB1 consists of the $p^+$ buried region 368 serving as a drain region, the i-type semiconductor region 367 serving as a drift region formed on the region 368, and an n-body region 366 formed on the region 367. On the surface of the n-body region 366, a $p^+$ region 365 serving as a source region is formed. On the regions 366 and 367, a gate insulation film 364 is formed. On the film 364, a third control electrode (third gate electrode) 363 is formed. On the gate electrode 363, an interlayer insulation film 802 having a contact hole is formed. Through the contact hole, a fifth main electrode (source electrode) 361 short-circuits the n-body region 366 to the source region 365. The buried drain region 368 is connected to the $p^+$ sinker region 369 on which a sixth main electrode (drain electrode) 370 is formed.

The pMOS transistor serving as the first main semiconductor element QA1 consists of the $p^+$ buried region 358 serving as a drain region, the i-type semiconductor region 357 serving as a drift region formed on the region 358, and an n-body region 356 formed on the region 357. On the region 356, a $p^+$ region 355 serving as a source region is formed. On the regions 356 and 257, a gate insulation film 354 is formed. On the gate insulation film 354, a first control electrode (first gate electrode) 353 is formed. On the gate electrode 353, the interlayer insulation film 302 is formed to have a contact hole Through the contact hole, a first main electrode (source electrode) 351 short-circuits the body region 356 to the source region 355. The buried drain region 358 is connected to the $p^+$ sinker region 359 on which a source electrode 301 of the second main semiconductor element QA2 extends to connect with the drain region 358. Namely, the source electrode 301 of the second main semiconductor element QA2 forms an intermediate terminal wire P connected to a second main electrode (drain electrode) of the first main semiconductor element QA1. The source electrode 361 of the first reference semiconductor element QB1 is connected to the source electrode 351 of the first main semiconductor element QA1 behind FIG. 6A.

The nMOS transistor serving as the second main semiconductor element QA2 consists of the $n^+$ drain region 308 serving as a drain region, the i-type semiconductor region 377 serving as a drift region formed on the region 308, and a p-body region 306 formed on the surface of the region 377. On the surface of the region 306, an $n^+$ region 305 serving as a source region is formed. On the regions 306 and. 377, a gate insulation film 304 is formed. On the gate insulation film 304, a second control electrode (second gate electrode) 303 is formed. On the gate electrode 303, the interlayer insulation film 302 is formed to have a contact hole. Through the contact hole, the intermediate terminal wire 301 serving as a third main electrode (source electrode) short-circuits the body region 306 to the source region 305. The $n^+$ buried drain region 308 is connected to the $n^+$ sinker region 319 on which a fourth main electrode (drain electrode) 310 is formed.

The nMOS transistor serving as the second reference semiconductor element QB2 consists of the $n^+$ region 348 serving as a drain region, the i-type semiconductor region 347 serving as a drift region formed on the region 848, and a p-body region 246 formed on the region 347. On the surface of the p-body region 346, an $n^+$ region 345 serving as a source region is formed. On the regions 346 and 347, a gate insulation film 344 is formed. On the gate insulation film 344, a fourth control electrode (fourth gate electrode) 343 is formed. On the gate electrode 343, the interlayer insulation film 302 is formed to have a contact hole. Through the contact hole, a seventh main electrode (source electrode) 841 short-circuits the p-body region 346 to the source region 345, The $n^+$ buried drain region 848 is connected to the $n^+$ sinker region (not shown), which is connected to an eighth main electrode (drain electrode) The source electrode 341 of the second reference semiconductor element QB2 and the source electrode 301 of the second main semiconductor element QA2 are connected to each other behind FIG. 6A.

Like the example of FIG. 3A, a first parasitic diode $D_{P1}$ of p-n junction structure is present between the n-body region 356 and the $p^+$ buried drain region 358 of the first main semiconductor element QA1. A second parasitic diode $D_{P2}$ of p-n junction structure is present between the p-body region 306 and the $n^+$ buried drain region 308 of the second main semiconductor element QA2. When a bias condition is set with the drain electrode 310 being negative and the intermediate terminal wire P being positive, the parasitic diode $D_{P2}$ becomes conductive. On the other hand, when a bias condition is set with the intermediate terminal wire P being positive and the source electrode 351 being negative, the parasitic diode $D_{r1}$ becomes conductive.

Manufacturing steps of the bidirectional switching device of FIG. 6A will be explained.

(a) The base substrate 501 is prepared from a p-type silicon substrate having an impurity concentration of $5 \times 10^{12}$ $cm^{-3}$ to $1 \times 10^{15}$ $cm^{-3}$ and a thickness of 250 μm to 600 μm. On the surface of the base substrate 501, the buried insulation film (SOI film) 502 of 1 μm to 10 μm thick is formed by, for example, thermal oxidation or chemical vapor deposition (CVD) method. The surface of the film 502 is polished to form a mirror surface. To thicken the film 502 to about 3 μm, high-pressure oxidation may be employed.

(b) A silicon substrate that is substantially of i-type having an impurity concentration of $1 \times 10^{11}$ $cm^{-3}$ to $5 \times 10^{12}$ $cm^{-3}$ or lower (hereinafter referred to as "the i-type substrate") is prepared. On the surface of the i-type substrate, photolithography and ion implantation are carried out to selectively form the $p^+$ buried drain regions 368 and 358 and $n^+$ buried drain regions 308 and 848. The base substrate 501 is bonded to the i-type substrate by the silicon-wafer direct bonding (SDB) method such that the surface where the regions 368, 358, 308, and 348 are formed is joined with the film 502. The SDB may be an anode bonding method that carries out a heat treatment by applying a voltage. The thickness of the i-type substrate is adjusted by polishing to a required thickness, for example, 10 μm to 50 μm. To reduce ON resistance, the metal layers 381 to 384 (FIG. 6B) may be prepared under the buried drain regions 868, 358, 308, and 348. In this case, refractory metal such as tungsten (W), titanium (Ti), and molybdenum (Mo) is deposited by CVD, spattering, or vacuum deposition method. After the deposition of the refractory metal, an annealing (or the silicidation) process may be carried out at a predetermined temperature to form refractory metal silicide such as $WSi_2$, $TiSi_2$, or $MoSi_2$ The refractory metal silicide may directly be formed by CVD or spattering method. Polysilicon CVD method may be further employed to form a composite film of polycide with the use of the silicide. Thereafter, the i-type substrate and the base substrate 501 are bonded together such that the metal layers 381 to 384 may contact with the film 502.

(c) The surface of the thickness-adjusted i-type substrate is chemically etched to remove a damaged layer. On the surface, an oxide film 34 of 0.3 μm to 1 μm thick is formed by thermal oxidation. On the oxidation film 34, a lattice pattern corresponding to the element isolation regions is formed by photolithography. More precisely, a photoresist mask is formed to cover the drain regions 368, 358, 308, and 348, and is patterned into the lattice corresponding to the element isolation regions. With the use of the patterned mask, the oxide film is etched by reactive ion etching (RIE) method using, for example, $CF_4$ or by electron cyclotron resonance (ECR) etching method. The mask used to etch the oxide film is removed, and the oxide film itself is used as a mask to etch the i-type substrate by RIE method using $CF_4+O_2$, $SF_6+O_2$, $SF_6+H_2$, $CCl_4$, or $SiCl_4$, or by microwave plasma etching, or by ECR etching method. This forms the element isolation trenches in the i-type substrate. When the metal layers 381 to 384 are formed, the element isolation trenches are formed through the metal layers 381 to 384.

(d) The insulation film (oxide film) 503 is formed on each side wall of the element isolation trenches by thermal oxidation. Each element isolation trench is buried with polycrystalline silicon without impurities, or the SIPOS by CVD method. The surfaces of the trenches are flattened by chemical mechanical polishing (CMP) method, and the SIPOS is filled to form the element isolation regions. This completes the i-type semiconductor regions 367, 357, 377, 347, etc., that are spatially independent of one another.

(e) Thereafter, the pMOS transistors and nMOS transistors are formed by standard CMOS fabrication processes. These IC fabrication processes are well known, and therefore, will not be explained. As is usual according to the standard CMOS fabrication processes, p wells may be formed in the i-type semiconductor regions 367 and 357 and n wells in the i-type semiconductor regions 377 and 347 by selective ion implantation and drive-in annealing. This, however, is not essential to the operation of the elements, and therefore, the i-type semiconductor regions 367, 357, 377, and 347 may be used as they are as drift regions, to reduce the number of processes.

The above explanation is based on the DI technology. The present invention is also applicable to a junction isolation (JI) structure, which is producible with known semiconductor techniques.

(POWER IC)

Figure 7A:
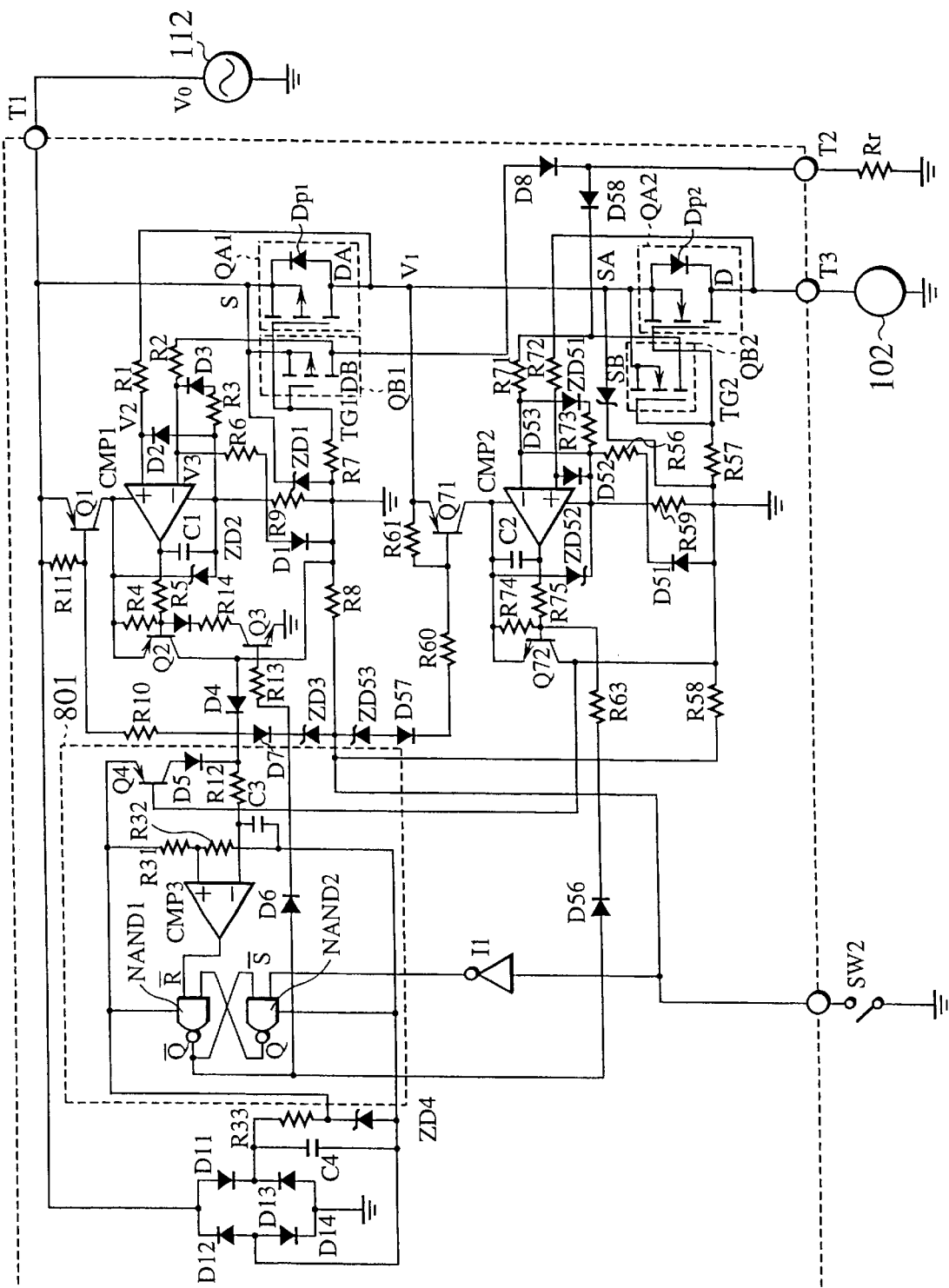
FIG. 7A is a circuit diagram showing a power IC according to still another embodiment of the present invention.

FIG. 7A is a circuit diagram showing a power IC according to still another embodiment of the present invention. The power IC has a pMOS transistor serving as a first main semiconductor element QA1 and an nMOS transistor serving as a second main semiconductor element QA2. A drain electrode (second main electrode) of the first main semiconductor element QA1 is connected to a source electrode (third main electrode) of the second main semiconductor element QA2. A drain electrode (fourth main electrode) of the second main semiconductor element QA2 is connected to a grounded side of an AC power source 112, and an ungrounded side of the AC power source 112 is connected to a source electrode (first main electrode) of the first main semiconductor element QA1. A load 102 is connected between the ground and the drain electrode of the second main semiconductor element QA2. A Zener diode ZD1 keeps a voltage of 12 V between a first control electrode (first gate electrode) of the first main semiconductor element QA1 and the source electrode S thereof, to bypass an overvoltage so that the overvoltage may not-be applied to a gate insulation film of the first main semiconductor element QA1. A Zener diode ZD51 keeps a voltage of 12 V between a second control electrode (second gate electrode) of the second main semiconductor element QA2 and the source electrode SA thereof, to bypass an overvoltage so that the overvoltage may not be applied to a gate insulation film of the second main semiconductor element QA2 A resistor R8 produces a potential difference between the first gate electrode and the ground The resistor R8 is grounded when a switch SW2 is closed. A resistor R58 produces a potential difference between the second gate electrode and the ground. The resistor R58 is grounded when the switch SW2 is closed.

According to the present invention, a MOS transistor serving as a first reference semiconductor element QB1 is connected to the source and gate electrodes of the first main semiconductor element QA1. The first reference semiconductor element QB1 is of the same type as the first main semiconductor element QA1 and has a smaller current handling capability than the first main semiconductor element QA1. A MOS transistor serving as a second reference semiconductor element Q32 is connected to the source and gate electrodes of the second main semiconductor element QA2. A drain electrode of the second reference semiconductor element Q32 is connected to a reference resistor Rr. The second reference semiconductor element QB2 is of the same type as the second main semiconductor element QA2 and has a smaller current handling capability than the second main semiconductor element QA2. For example, the first main semiconductor element QA1 consists of N1 first unit cells, and the first reference semiconductor element QB1 consists of N2 first unit cells with N1>>N2. Similarly, the second main semiconductor element QA2 consists of N3 second unit cells, and the second reference semiconductor element QB2 consists of N4 second unit cells. Namely, each of the first and second main semiconductor elements QA1 and QA2 has a multi-channel structure formed of a plurality of unit cells connected in parallel to realize a rated current handling capability. The current handling capability of each of the first and second reference semiconductor elements QB1 and QB2 is set to be smaller than that of the corresponding main semiconductor element by adjusting the number of the parallel-connected unit cells. Here, a current dividing ratio is determined as N1:N2, or N3:N4. For example, the first reference semiconductor element QB1 is made of N2 unit cell (N2=1), and the first main semiconductor element QA1 is made of N1 unit cells (N1=1000). As a result, the ratio of the channel width of the first reference semiconductor element to that of the first main semiconductor element becomes 1:1000, which determines a current dividing ratio. Similarly, the second reference semiconductor element Q32 is made of N4 unit cell, and the second main semiconductor element QA2 is made of N3 unit cells so as to define a required current dividing ratio N3:N4.

A first comparator CMP1 has a positive input terminal connected to the second main electrode (drain electrode) of the first main semiconductor element QA1 through a resistor R1. A negative input terminal of the first comparator CMP1 is connected to a sixth main electrode (drain electrode) of the first reference semiconductor element QB1 through a resistor R2. A second comparator CMP2 has a positive input terminal connected to the fourth main electrode (drain electrode) of the second main semiconductor element QA2 through a resistor R72. A negative input terminal of the second comparator CMP2 is connected to an eighth main electrode (drain electrode) of the second reference semiconductor element QB2 through a resistor R71.

A first transistor Q1 is connected between the first main electrode S of the first main semiconductor element QA1 and a higher-level power supply terminal of the first comparator CMP1. A resistor R9 is connected between a lower-level power supply terminal of the first comparator CMP1 and the ground. A second transistor Q71 is connected between the second main electrode DA of the first main semiconductor element QA1 a lower-level power supply terminal of the second comparator CMP2. A resistor R59 is connected between a higher-level power supply terminal of the second comparator CMP2 and the ground. The higher-level power supply terminal of the first comparator CMP1 is connected to an emitter electrode of a third transistor Q2, and an output terminal of the first comparator CMP1 is connected to a base electrode of the third transistor Q2. The lower-level power supply terminal of the second comparator CMP2 is connected to an emitter electrode of a fourth transistor Q72, and an output terminal of the second comparator CMP2 is connected to a base electrode of the fourth transistor Q72. Consequently, the output terminal of the first comparator CMP1 is connected to the first and third- gate electrodes of the first main and reference semiconductor elements QA1 and QB1 through the third transistor Q2. The output terminal of the second comparator CMP2 is connected to the second and fourth gate electrodes of the second main and reference semiconductor elements QA2 and QB2 through the fourth transistor Q72.

A collector electrode of the third transistor Q2 is connected to a reverse current preventive diode D4, which is connected to an ON/OFF accumulator 801 The power IC further has a bridge circuit composed of four diodes D11 to D14 connected between the first main electrode S and the ground GND. Two middle points of the bridge circuit are connected to a power source capacitor C4. Ends of the capacitor C4 are connected to a series circuit consisting of a power source resistor R33 and a power source Zener diode ZD4. A terminal potential of the Zener diode ZD4 is used as a power supply voltage for the ON/OFF accumulator 801.

(OPERATION OF THE POWER IC)

The operation of the power IC of FIG. 7A will be explained.

1. Operation when AC voltage Vo is positive with respect to ground potential.

(a) The AC voltage Vo is from commercial AC power supply having an effective value of 100 V and a frequency of 50 Hz. One side of the AC power source 112 is grounded. When the switch SW2 is closed, the gate electrodes of the first main semiconductor element QA1, first reference semiconductor element QB1, second main semiconductor element QA2, and second reference semiconductor element QB2 are grounded through the switch SW2, resistors R8 and R58, etc. When the ungrounded side of the AC power source 112 increases to be positive, the gate electrodes of the elements QA1, QB1, QA2, and QB2 decrease with respect to potential at the source electrodes thereof. As a result, the first main semiconductor element QA1 and first reference semiconductor element QB1 turn on because they are of p-channel. On the other hand, the second main semiconductor element QA2 and second reference semiconductor element QB2 turn off because they are of n-channel. Accordingly, a current flows from the ungrounded side of the AC power source 112 through the first main semiconductor element QA1, a parasitic diode $D_{P2}$ contained in the second main semiconductor element QA2, and the load 102 to the grounded side of the AC power source 112.

(b) The potential at the gate electrodes of the first main and reference semiconductor elements QA1 and QB1 gradually decreases with respect to the potential at the source electrodes thereof. The potential difference between the source and gate electrodes of each of the elements QA1 and QB1 is clamped by the Zener diode ZD1, and therefore, never increases above the Zener voltage of 12 V of the Zener diode ZD1.

(c) The ungrounded side of the AC power source 112 applies the power supply voltage Vo to a Zener diode ZD3 through resistors R11 and R10 and a diode D7 When the power supply voltage Vo increases to increase a terminal voltage of the Zener diode ZD3 above a Zener voltage of 80 V, the Zener diode ZD3 becomes conductive. This passes a base current to the bipolar transistor Q1, which turns on. Then, the first comparator CMP1 receives source power to start an overcurrent testing function. At this time, a current flows from the collector electrode of the transistor Q1 to a Zener diode ZD2 to the resistor R9 to the ground. As a result, a terminal potential difference of the first comparator CMP1 is clamped at the Zener voltage of 12 V of the Zener diode ZD2. A remaining voltage of "Vo–12 V" of the power supply voltage is applied to the ends of the resistor R9.

(d) The first comparator CMP1 has input terminal potentials V2 and V3. The potentials V2 and V3 are clamped by diodes D2 and D1 at the anode potential of the Zener diode ZD2. The potential V2 may decrease to a level that is lower than the anode potential of the Zener diode ZD2 by a forward voltage drop of 0.7 V of the diode D2. The potential V2 never decreases further. If the ON voltage of the bipolar transistor Q1 is 0.3 V, the following is established due to the Zener voltage of 12 V of the Zener diode ZD2:

$$V2=Vo-0.3\ V-12\ V-0.7\ V=Vo-13\ V \tag{1}$$

The potential V3 is clamped at a potential that is lower than the potential V2 by a voltage drop due to the resistor R3. Namely, V2>V3 when the input terminal potentials V2 and V3 are clamped by the diodes D2 and D3. As a result, the output of the first he comparator CMP1 is kept at high. Under this state, no base current flows to the bipolar transistor Q2, and therefore, the transistor Q2 is in a non-conducting state.

(e) When potentials $V_{DA}$ and $V_{DB}$ at the drain electrodes DA and DB of the first main and reference semiconductor elements QA1 and QB1 increase higher than potential at the anode of the Zener diode ZD2, the first comparator CMP1 starts an overcurrent test. A current passes from the drain electrode DB of the first reference semiconductor element QB1 to the resistor R2 to the resistor R6 to the diode D1 to the resistor R8 to the switch SW2 and to the ground. This current causes a voltage drop at the resistor R2. Even if $V_{DA}=V_{DB}$, potential at the positive input terminal of the first comparator CMP1 becomes higher than that at the negative input terminal thereof. As explained above, the number N1 of unit cells of the first main semiconductor element QA1 is greater than the number N2 of unit cells of the first reference semiconductor element QB1. Namely. N1>N2, and N1:N2= 1000:1. The elements QA1 and QB1 have ON resistance values $Ron_{A1}$ and $Ron_{B1}$, respectively, and a p-channel MOS transistor serving as the unit cell has an ON resistance of Ru. Then, the following is established;

$$Ron_{A1}=Ru/N1 \tag{2}$$

$$Ron_{B1}=Ru/N2 \tag{3}$$

Under a normal state, resistance between the first main semiconductor element QA1 and the AC power source 112 (the grounded side) is the sum of load resistance $R_L$, wiring resistance $R_I$, and inductance-equivalent resistance $R_X$. The sum is a total load resistance $R_T$ as follows:

$$R_T = R_I + R_l + R_X \quad (4)$$

The inductance-equivalent resistance $R_X$ is calculated by converting a voltage induced by a change in a load current into resistance according to wiring inductance. The inductance-equivalent resistance $R_X$ is positive for an increasing current and negative for a decreasing current. The total load resistance $R_T$ is within a specific range if the load and wiring are normal, although there are some fluctuations due to parts variations. If the load resistance $R_L$ involves a short-circuit failure, or if the wiring is grounded due to a short circuit failure, or if an incomplete short-circuit (with a finite resistance value) occurs, the total load resistance $R_T$ decreases below the normal value. In an overload range outside a normal range, a resistance value close to the normal range is set as $R_{Lim}$. Then, $R_T > R_{Lim}$. If the total load resistance $R_T$ becomes smaller than $R_{Lim}$, it is determined as overload. The first comparator CMP1 carries out an overload test in the range of 80 V<Vo<141 V. If the load resistance $R_L$ is equal to $R_{Lim}$ in the overload testing range, the first main semiconductor element QA1 passes a current of $I_{DLim}$. The ON resistance of the parasitic diode $D_{P2}$ of the second main semiconductor element QA2 is very small and ignorable.

$$I_{DLim} = (Vo - Ron_{A1})/R_{Lim} \cong Vo/R_{Lim} \quad (5)$$

At this time, the drain-source voltage of the first main semiconductor element QA1 is $V_{SDA}$ expressed as follows:

$$V_{SDA} = I_{DLim} \times Ron_{A1} = Vo/R_{Lim} \times Ru/N1 \quad (6)$$

On the other hand, the first reference semiconductor element QB1 passes a current $I_{DB1}$ as follows:

$$I_{DB1} = (Vo - ROn_{B1} - V_{FD})/Rr \cong Vo/Rr \quad (7)$$

where $V_{FD}$ is a forward voltage drop (ON voltage) of a diode D8 connected to the drain electrode of the first reference semiconductor element QB1. The drain-source voltage $V_{SDB}$ of the first reference semiconductor element QB1 is as follows:

$$V_{SDB} = I_{DB1} \times Ron_{B1} = Vo/Rr \times Ru/N2 \quad (8)$$

The reference resistor Rr is set to make $V_{SDA} = V_{SDB}$. Then, the following is obtained from the expressions (6) and (8):

$$Vo/R_{Lim} \times Ru/N1 \cong Vo/Rr \times Ru/N2 \quad (9)$$

$$\therefore Rr = N1/N2 \times R_{Lim} = 1000 \times R_{Lim} \quad (10)$$

If the reference resistor Rr is set to satisfy the expression (10), then $V_{SDA} < V_{SDB}$ under a normal state and $V_{SDA} > V_{SDB}$ under an overload state (an abnormal state of wiring or load). Since the first main and reference semiconductor elements QA1 and QB1 are connected to each other through their sources and gates, $V_{DA} > V_{DB}$ under a normal state and $V_{DA} < V_{DB}$ under an abnormal state. Consequently, comparing the drain potential $V_{DA}$ of the first main semiconductor element QA1 with the drain potential $V_{DB}$ of the first reference semiconductor element QB1 determines whether or not load and wiring are normal.

(f) While a current flowing through the first main semiconductor element QA1 is normal, $V_{DA} > V_{DB}$, and the first comparator CMP1 provides an output of high level. The bipolar transistor Q2 is in the nonconducting state, and the first main and reference semiconductor elements QA1 and QB1 keep the conducting state. If an overcurrent flows to the first main semiconductor element QA1, then $V_{DA} < V_{DB}$, and the first comparator CMP1 provides an output of low level. The bipolar transistor Q2 turns on, and the gates of the first main and reference semiconductor elements QA1 and QB1 are clamped at a voltage that is about 0.6 V lower than a source voltage. This results in turning off the first main and reference semiconductor elements QA1 and QB1. At this time, a current passing through the resistor R6 connected to the negative input terminal of the first comparator CMP1 decreases, to reduce a voltage drop at the resistor R2. This results in increasing the potential at the negative input terminal of the first comparator CMP1. This achieves a hysteresis effect.

(g) Even if the first main and reference semiconductor elements QA1 and QB1 are turned off, the relationship of $V_{DA} < V_{DB}$ is maintained under an overload state. Accordingly, the elements QA1 and QB1 maintain the nonconducting state to expand the source-drain potential difference between the elements QA1 and QB1. As a result, the input terminal potentials V2 and V3 of the first comparator CMP1 drop and are clamped at the anode potential of the Zener diode ZD2 due to the diodes D2 and D3. This changes the output of the first comparator CMP1 from low to high, to turn off the bipolar transistor Q2. The first comparator CMP1 is an open-collector comparator, and therefore, a base current of the transistor Q2 flows while a charging current for a capacitor C1 is flowing, even if the output of the first comparator CMP1 is high. As a result, the transistor Q2 keeps the conducting state. When the capacitor C1 is charged to turn off the transistor Q2, the drain potentials $V_{DA}$ and $V_{DB}$ drop nearly to the ground potential. In this way, there is a time difference between a time point when the output of the first comparator CMP1 is inverted and a time point when the first main and reference semiconductor elements QA1 and QB1 are turned on.

(h) When the bipolar transistor Q2 turns off, the gate potentials of the first main and reference semiconductor elements QA1 and QB1 decrease to turn on the elements QA1 and QB1. As a result, the drain potentials $V_{DA}$ and $V_{DB}$ start to increase. When the drain potentials $V_{DA}$ and $V_{DB}$ exceed the anode potential of the Zener diode ZD2 and if it is an overload state, the output of the first comparator CMP1 changes to low. This results in turning on the transistor Q2 and off the first main and reference semiconductor elements QA1 and QB1. In this way, if an overload state lasts in the range of Vo>80 V; the first main and reference semiconductor in elements QA1 and QB1 are repeatedly turned on and off 2. Operation when AC voltage Vo is negative with respect to ground potential This operation is substantially symmetrical to the above-mentioned operation with the AC voltage Vo being positive. In this operation, the second main and reference semiconductor elements QA2 and QB2, which are n-channel MOS transistors, operate instead of the first main and reference semiconductor elements QA1 and QB1 that are p-channel MOS transistors. Instead of the bipolar transistors Q1 and Q2 that are pnp bipolar transistors, bipolar transistors Q71 and Q72 that are npn bipolar transistors work for the second main and reference semiconductor elements QA2 and QB2. Except the directions of currents and voltages that are opposite to those of the case with the AC voltage Vo being positive, the operation of the case with the AC voltage Vo being negative is the same as that mentioned above, and therefore, will not be explained again.

3. Accumulating the number of ON/OFF operations (a) While ON/OFF operations are repeated under an overload state, the bipolar transistor Q2 or Q72 keeps the ON/OFF transition. On the other hand, the AC voltage Vo is applied to the diodes D11 to D14 that form the bridge circuit. When the AC voltage Vo is positive, a current flows from the AC power source 112 to the diode D11 to the capacitor C4 to the diode D14 to the ground, thereby charging the capacitor C4. If the AC voltage Vo is negative, a current flows from the ground to the diode D13 to the capacitor C4 to the diode D12 to the AC power source 112, thereby charging the capacitor C4 in the same direction. The voltage of the capacitor C4 pulsates, and therefore, the capacitor C4 is connected in parallel to the series circuit consisting of the resistor R33 and Zener diode ZD4. A terminal potential difference of the Zener diode ZD4 is used as a floating power source for the ON/OFF accumulator 801 consisting of NAND circuits NAND1 and NAND2 and a comparator CMP3. The NAND1 and NAND2 form a NAND-type flip-flop. A voltage from the floating power source that uses the terminal potential difference of the Zener diode ZD4 is divided by resistors R31 and R32, and the divided voltage is used as a reference voltage to a positive input terminal of the comparator CMP3. A negative input terminal of the comparator CMP3 is equal to a zero potential of the floating power source, i.e., an anode potential of the Zener diode ZD4 under a normal state. At this time, the comparator CMP3 provides an a output of high level. When the AC voltage Vo becomes positive with the switch SW2 being OFF, a high level is applied from the ungrounded side of the AC power source 112 to an input of an inverter I1 through the resistors R11 and R10, diode D7; and Zener diode ZD3 (or through the Zener diode ZD1 and resistor R8). As a result, the inverter I1 provides an output of low level, and an output /IQ (Q bar) of the NAND1 becomes low. If the switch SW2 is closed and the output of the comparator CMP3 is high, the output /Q, of the NAND1 is kept at low.

(b) If an overload state occurs with the AC voltage Vo being positive, the bipolar transistor Q2 turns on, and a current flows from the transistor Q2 to the diode D4 to the resistor R12 to the capacitor C3, thereby charging the capacitor C3. If an overload state occurs with the AC voltage Mo being negative, the transistor Q72 turns on to turn on the transistor Q4, and a current flows from the transistor Q4 to the diode D5 to the resistor R12 to the capacitor C3, thereby charging the capacitor C3. The ON/OFF operations are repeated to charge the capacitor C3 of the ON/OFF accumulator 801 to increase potential at the negative input terminal of the comparator CMP3. After a predetermined number of ON/OFF operations, the potential at the negative input terminal of the comparator CMP3 exceeds potential (reference value) at the positive input terminal of the comparator CMP3, to change the output of the comparator CMP3 to low. As a result, the output/Q of the NAND1 changes from low to high. Then, with the AC voltage Vo being positive, a current flows from a diode D6 to the resistor R13 to the base electrode of the transistor Q3, to turn on the transistor Q3. This turns on the bipolar transistor Q2, to turn off the first main and reference semiconductor elements QA1 and QB1. With the AC in voltage Vo being negative, a current flows from a diode D56 to a resistor R63 to the base electrode of the transistor Q72, to turn off the second main and reference semiconductor elements QA2 and QB2. Once these elements are turned off, they are kept off while the switch SW2 is ON.

Figure 7B:
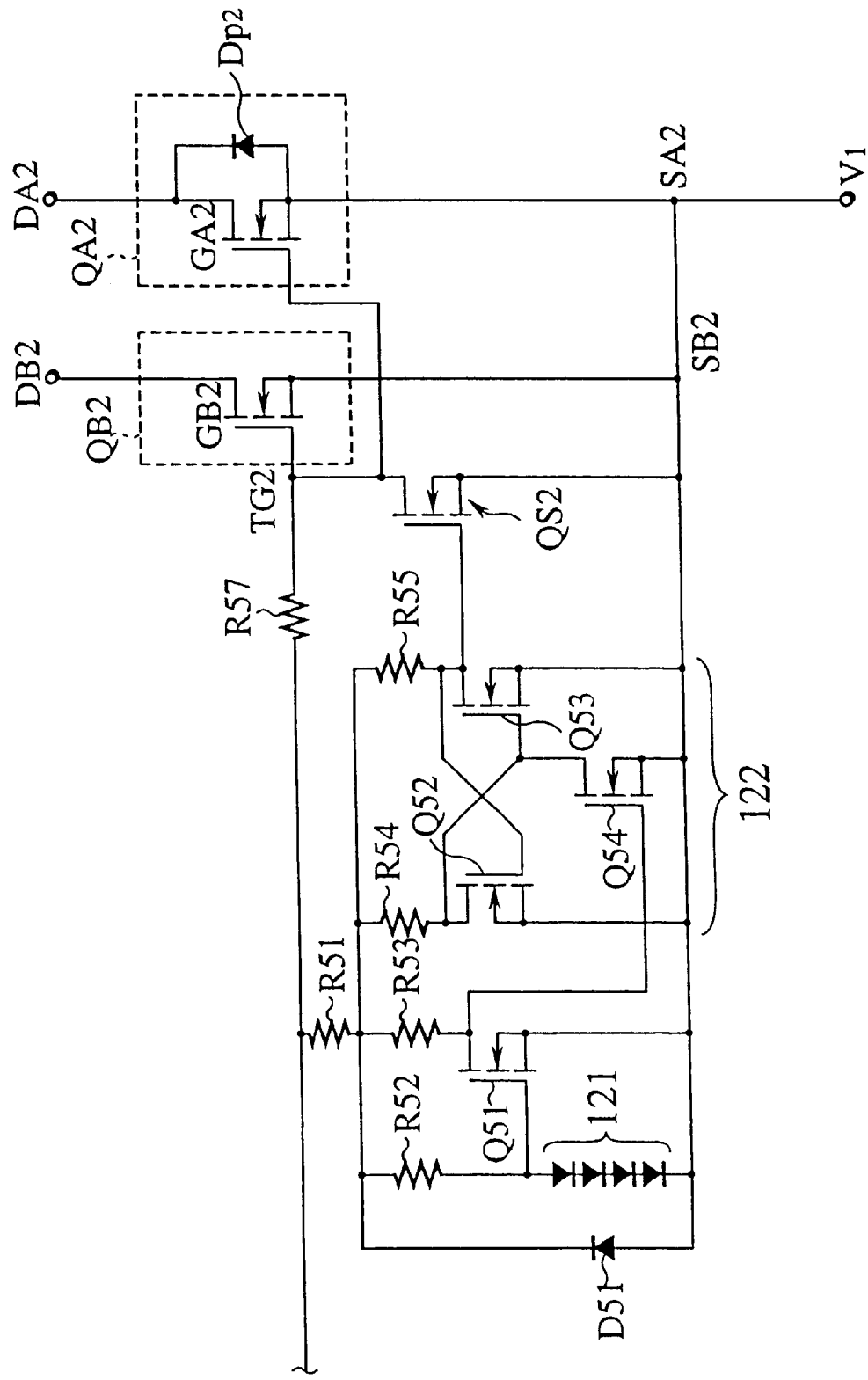
FIG. 7B is a circuit diagram showing a temperature sensor arranged in the vicinity of the second main semiconductor element of a bidirectional switching device of the present invention.
Figure 7C:
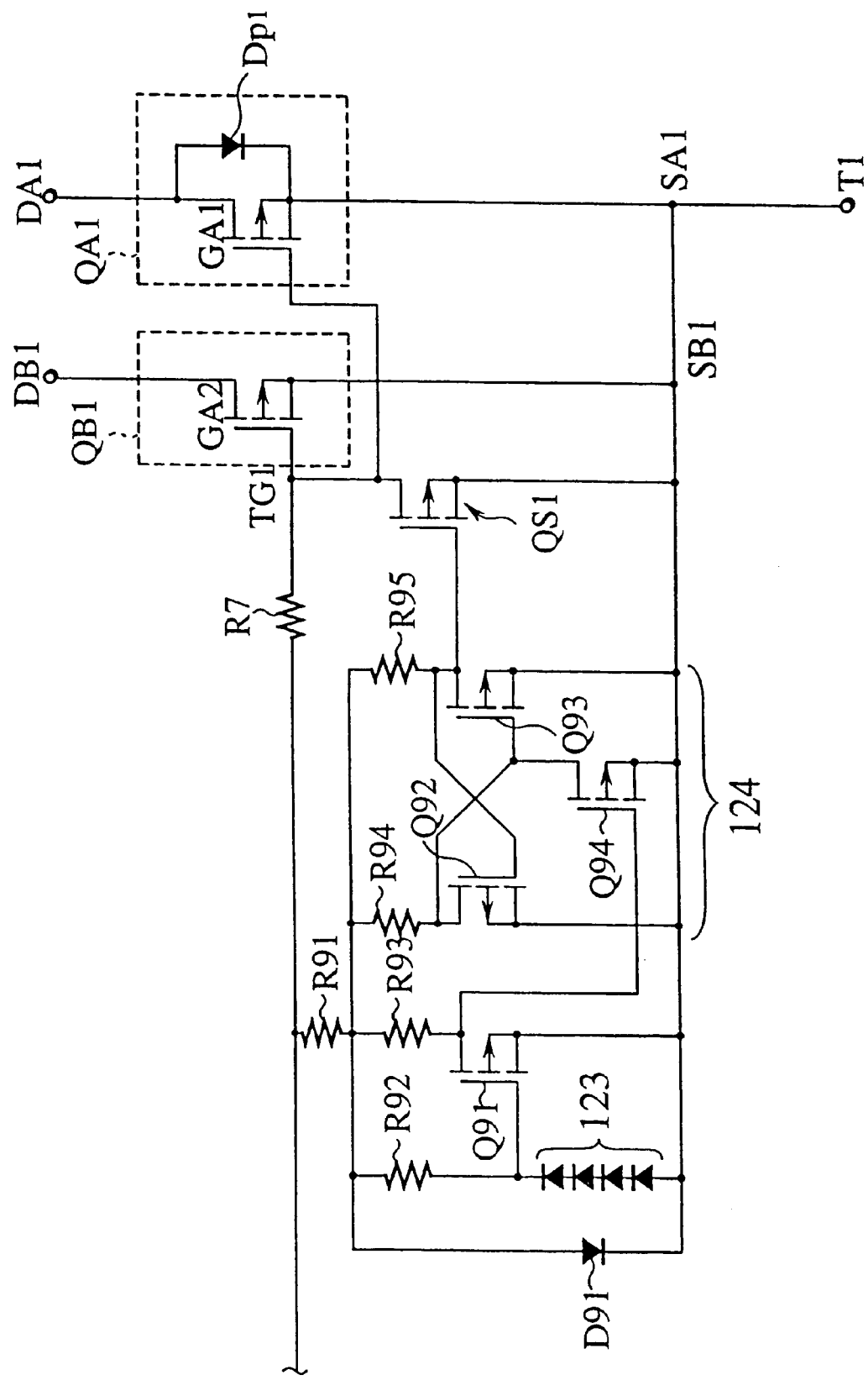
FIG. 7C is a circuit diagram showing a temperature sensor arranged in the vicinity of the first main semiconductor element of a bidirectional, switching device of the present invention.

(c) FIGS. 7B and 7C show examples that provide the first main semiconductor element QA1 with a temperature sensor 123 and the second main semiconductor element QA2 with a temperature sensor 121 to accelerate the heating of semiconductor chips on which the elements QA1 and QA2 are formed, by producing current oscillations. If the temperatures of the semiconductor chips increase, it is detected to turn off the first main semiconductor element QA1 and second main semiconductor element QA2. If the first main semiconductor element QA1 or second main semiconductor element QA2 is turned off due to overheat, the. NAND-type flip-flop is inverted to maintain the OFF states of the elements. In FIG. 7B, the second main semiconductor element QA2 is controlled by a control circuit, or "a thermal protector" consisting of a resistor R57, a second temperature sensor 121, a second latch. 122, and a second thermal cutoff element QS2. The second thermal cutoff element QS2 is, for example, an nMOS transistor, The thermal protector is integrated with the second main semiconductor element QA2 on the same semiconductor chip. If the second temperature sensor 121 detects that the temperature of the semiconductor chip is above a predetermined level, the detected information is latched by the second latch 122 to turn on the second thermal cutoff element QS2, which forcibly turns off the second main semiconductor element QA2. The second temperature sensor 121 consists of four diodes made of, for example, polysilicon and connected in series. As the temperature of the semiconductor chip increases, a forward voltage of the diodes of the second temperature sensor 121 drops to decrease the gate potential of an nMOS transistor Q51 to low. This changes the nMOS transistor Q51 from ON to OFF. Then, the gate potential of an nMOS transistor Q54 is pulled up to the potential of the gate control terminal GA2 of the second main semiconductor element QA2, to turn on the nMOS transistor Q54. This drops the gate potential of an nMOS transistor Q53 to turn off the nMOS transistor Q53. This changes an nMOS transistor Q52 from OFF to ON, and the latch 122 latches In "1" and provides an output of high level. This output changes the second thermal cutoff element QS2 from OFF to ON, to short-circuit between the true gate TG and source SA2 of the second main semiconductor element QA2 to low, thereby changing the second main semiconductor element QA2 from ON to OFF. Namely, the second main semiconductor element QA2 is turned off due to overheat.

FIG. 7C shows the other control circuit, or "the other thermal protector" for controlling the first main semiconductor element QA1. The second thermal protector consists of a resistor R7, the first temperature sensor 123, a first latch 124, and a first thermal cutoff element QS1. The first thermal cutoff element QS1 is a pMOS transistor, for example. The other thermal protector is integrated with the first main semiconductor element QA1 on the same semiconductor chip. The first temperature sensor 123 consists of four diodes made of, for example, polysilicon and connected in series. As the first temperature of the semiconductor chip increases, a forward voltage of the four diodes drops to make the gate potential of a pMOS transistor Q91 high to turn off the pMOS transistor Q91. This pulls down the gate potential of a pMOS transistor Q94 to the potential of the gate control terminal GA1 of the first main semiconductor element QA1, to turn on the transistor Q94. This turns off a pMOS transistor Q93 to turn on a pMOS transistor Q92. As a result, the first latch 124 latches "1" and provides an output of low level to turn on the thermal cutoff element QS1. This increases the potential of the true gate TG of the first main semiconductor element QA1 to turn the first main semiconductor element QA1 off.

(SWITCHING CHARACTERISTICS OF THE POWER IC)

Figure 8:
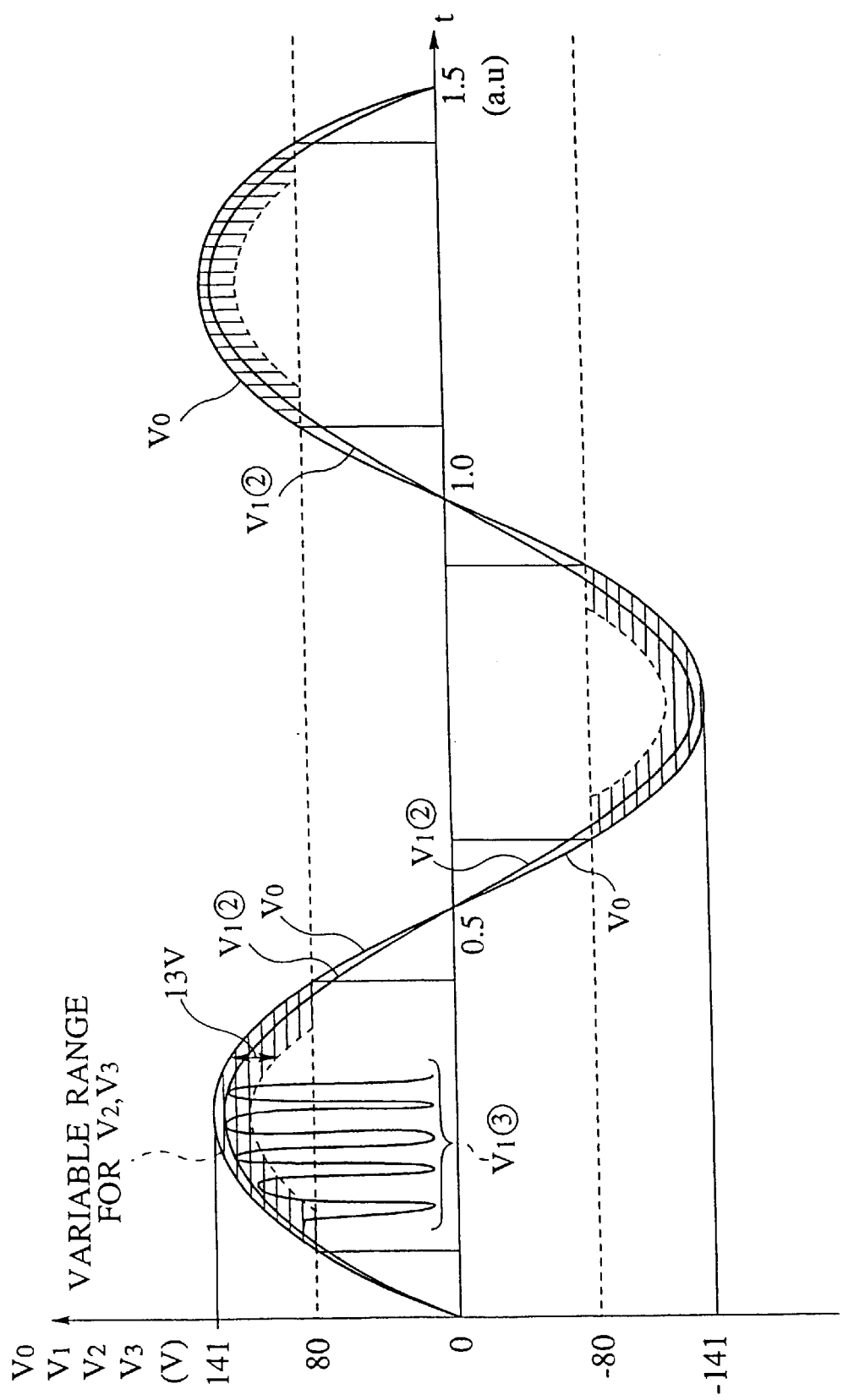
FIG. 8 is a graph showing transient behaviors of AC voltage applied to the power IC of the present invention.

FIG. 8 is a waveform diagram of the power IC according to the present invention. A curve Vo corresponds to the power supply voltage Vo of FIG. 7A. V2 and V3 represent potentials at the positive and negative input terminals of the first comparator CMP1 (or the second comparator CMP2). A curve V1② corresponds to a drain voltage of the first main semiconductor element QA1 (or the second main semiconductor element QA2) under a normal state and is lower than the voltage Vo by the sum of a source-drain voltage and a parasitic diode voltage drop, A curve V1③ corresponds to a drain voltage of the first main semiconductor element QA1 (or the second main semiconductor element QA2) under an overload state. As mentioned above, the first main semiconductor element QA1 (second main semiconductor element QA2) carries out ON/OFF operations to produce an oscillating drain voltage waveform. At this time, the input terminal potentials V2 and V3 of the first comparator CMP1 (second comparator CMP2) are in hatched areas of FIG. 8 where Vo>80 V or Vo<-80 V and where the overload testing function works. Although the values V2 and V3 may deviate from Vo by 13 V at the maximum, the oscillating waveform V1③ deviates from Vo by more than 13 V. This is because the capacitor C1 (FIG. 7A) connected to the output terminal of the first comparator CMP1 substantially extends an OFF period of the first main semiconductor element QA1.

Although not shown in FIG. 8, the waveform of a drain voltage of the second main semiconductor element QA2 also oscillates in the overload state, when the AC voltage Vo is negative with respect to the ground potential. At this time, V2 and V3 at the input terminals of the second comparator CMP2 may deviate from Vo by 13 V at the maximum in absolute value, while an oscillating waveform V1③ related to the element QA2 deviate from Vo by more than 13 V. This is because the capacitor C2 connected to the output terminal of the second comparator CMP2 substantially extends an OFF period of the second main semiconductor element QA2.

(STRUCTURE OF POWER IC)

Packaging structures for power ICs according to the present invention will be explained. The first main semiconductor element QA1, first reference semiconductor element QB1, second main semiconductor element QA2, second reference semiconductor element QB2, first comparator CMP1, second comparator CMP2, ON/OFF accumulator 801, inverter I1, bridge circuit, etc., of FIG. 7A may entirely be integrated on a single semiconductor chip, to realize a power IC that is small and light.

Figure 9:
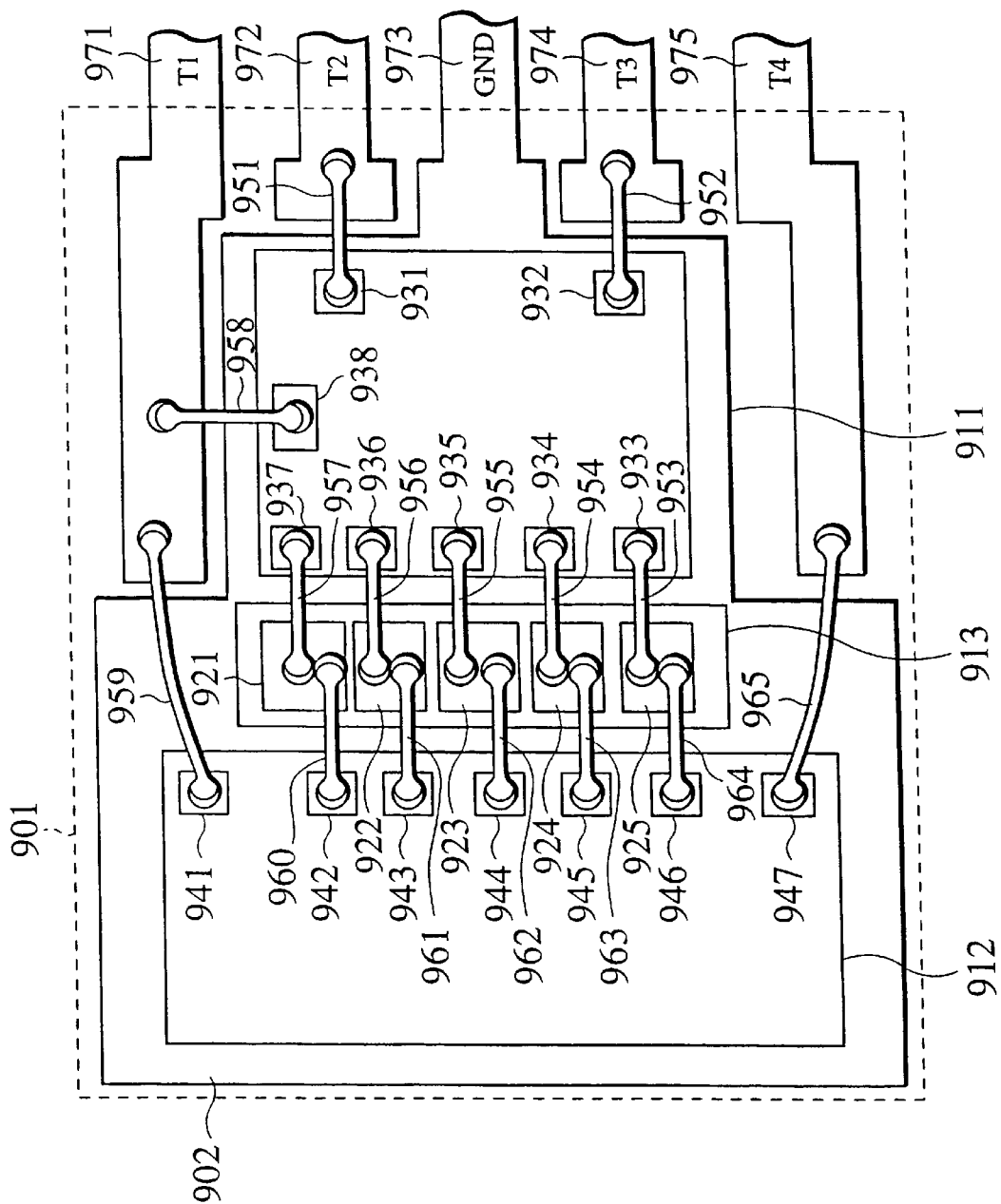
FIG. 9 is a plan view showing an example of an MCM for packaging the power IC of FIG. 7A according to the present invention.

Instead, the first main semiconductor element QA1, first reference semiconductor element QB1, second main semiconductor element QA2, and second reference semiconductor element QB2 may be integrated on a single semiconductor chip ("power chip") 911 as shown in FIG. 9. The first comparator CMP1, second comparator CMP2, ON/OFF accumulator 801, inverter I1, bridge circuit, etc., that serve as control circuit are integrated on another separate semiconductor chip ("control chip") 912. The chips 911 and 912 are mounted on a single package base 901 to form a multi-chip module (MCM) or a hybrid IC.

The MCM of FIG. 9 includes a conductive support plate 902 arranged on the package base 901. The power chip 911 and control chip 912 are arranged on the support plate 902. Intermediate terminals 921 to 925 are formed on an insulator 913 that is placed on the support plate 902. At the periphery of the package base 901, there are a first lead 971 serving as a terminal T1, a second lead 972 serving as a terminal T2, a third lead 973 serving as a ground terminal GND, a fourth lead 974 serving as a terminal T3, and a fifth lead 975 serving as a terminal T4.

Bonding pads 933 to 937 on the power chip 911 are connected to bonding pads 942 to 946 on the control chip 912 through the intermediate terminal 921 to 925, bonding wires 953 to 957, and bonding wires 960 to 964, Bonding pads 931, 932, and 938 on the power chip 911 are connected to the second lead 972, fourth lead 974, and first lead 971 through bonding wires 951, 952, and 958, respectively. Bonding pads 941 and 947 on the control chip 912 are connected to the first lead 971 and fifth lead 975 through bonding wires 959 and 965, respectively.

To transport heat from the power chip 911 and control chip 912, the package base 901 is made of insulating material having high heat conductivity, such as ceramics. The package base 901 may be an insulating base made of, for example, epoxy resin, Bakelite, or ABS resin.

The support plate 902 and leads 971 to 975 are patterned from metal material by, for example, punching or etching. The metal material may be made of aluminum (Al), copper (Cu), copper alloy such as Cu—Fe, Cu—Cr, Cu—Ni—Si, and Cu—Sn, nickel-iron alloy such as Ni—Fe and Fe—Ni—Co, or a composite material of copper and stainless steel. The metal material may be plated with nickel (Ni), gold (Au), etc. The parts mentioned above are sealed with resin or a packaging can.

To make the bidirectional switching device of the present invention into a hybrid IC, the control circuit including the first comparator CMP1, second comparator CMP2, ON/OFF accumulator 801, inverter I1, bridge circuit, etc., may monolithically be integrated on a single semiconductor chip. At the same time, the first main semiconductor element QA1, first reference semiconductor element QB1, second main semiconductor element QA2, and second reference semiconductor element QB2 are prepared as discrete circuit elements and, with the semiconductor chip, are mounted on a single package base or a circuit board.

(OTHER EMBODIMENTS)

Figure 10:
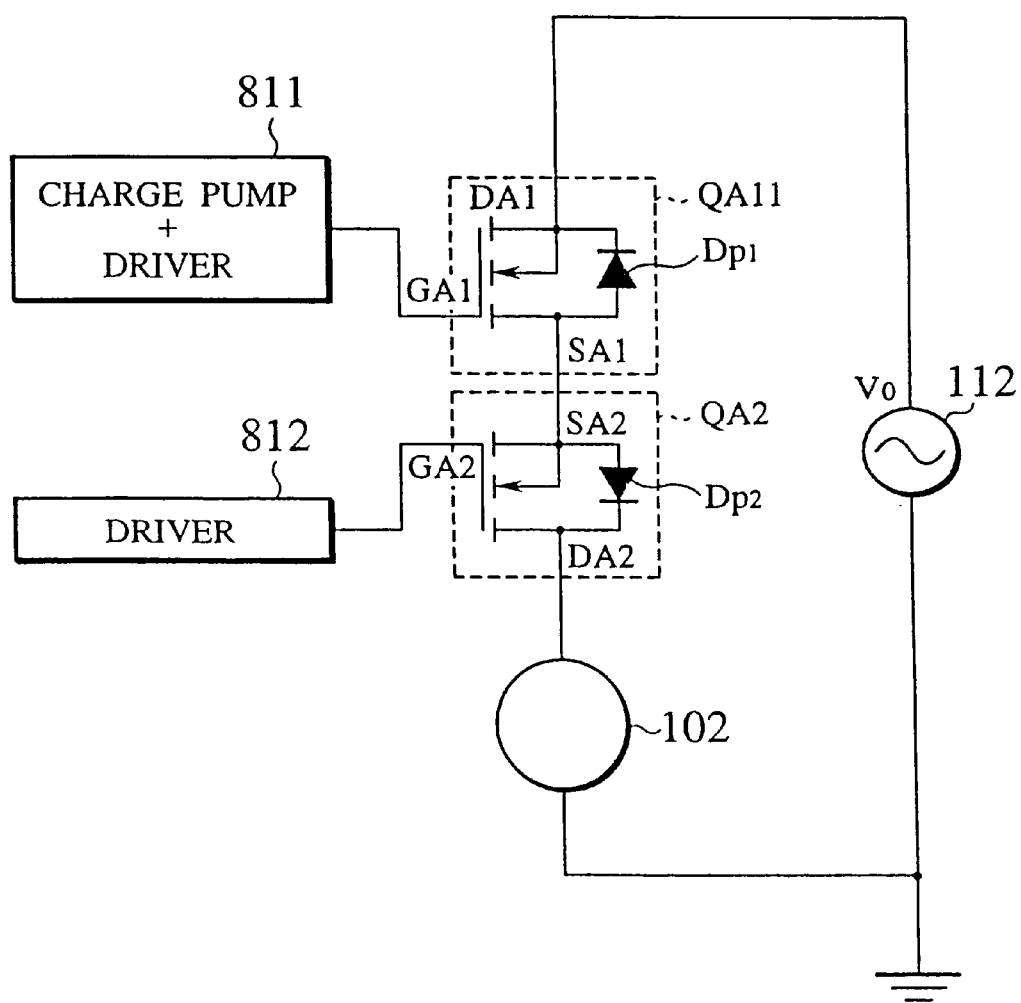
FIG. 10 shows a bidirectional switching device according to still another embodiment of the present invention.

Various modifications will become possible for those skilled in the art after receiving the teachings of the present disclosure without departing from the scope thereof. For example, FIG. 10 shows a power IC according to still another embodiment of the present invention. The power IC consists of an n-channel first main semiconductor element QA11 and an n-channel second main semiconductor element QA2. The first main semiconductor element QA11 has a first main electrode DA1 connected to an ungrounded side of an AC power source 112, a second main electrode SA1 opposing to the first main electrode DA1, and a first control electrode GA1 for controlling a main current flowing between the first and second main electrodes The second main semiconductor element QA2 has a third main electrode SA2 connected to the second main electrode SA1, a fourth main electrode DA2 opposing to the third main electrode SA2 and connected to a load, and a second control electrode GA2 for controlling a main current flowing between the third and fourth main electrodes, The first control electrode GA1 is connected to a first driver 811 stepped up by a charge pump. The second control electrode GA2 is connected to a second driver 812 that is different from the first driver 811. The first main semiconductor element QA11 contains a first parasitic diode $D_{P1}$ whose cathode region is connected to the first main electrode and whose anode region is connected to the second main electrode. The second main semiconductor element QA2 contains a second parasitic diode $D_{P2}$ whose anode region is connected to the third main electrode SA2 and whose cathode region is connected to the fourth main electrode DA2.

More precisely, the first main semiconductor element QA11 is made of an nMOS transistor whose main electrode (source electrode) SA1 is connected to the third main electrode (source electrode) SA2 of the second main semiconductor element QA2 that is made of an nMOS transistor. A grounded side of the AC power source 112 is connected to the fourth main electrode (drain electrode) DA2 of the second main semiconductor element QA2 through the load 102. Namely, the load 102 is connected between the ground GND and the fourth main electrode (drain electrode) DA2 of the second main semiconductor element QA2.

An alternating-current path to be formed when the bidirectional switching device is energized will be explained. When potential at the first main electrode (drain electrode) DA1 of the first main semiconductor element QA11 is positive, the element QA11 is ON, and the second main semiconductor element QA2 is OFF. In this case, a current flows from the first main electrode (drain electrode) DA1 to the second main electrode (source electrode) SA1 and passes through the second parasitic diode $D_{P2}$ that is present between the third main electrode (source electrode) SA2 and fourth main electrode (drain electrode) DA2 of the second main semiconductor element QA2.

When the potential at the first main electrode (drain electrode) DA1 of the first main semiconductor element QA11 becomes negative, the element QA11 turns off, and the second main semiconductor element QA2 on. Then, a current flows from the fourth main electrode (drain electrode) DA2 to the third main electrode (source electrode) SA2 and passes through the first parasitic diode $D_{P1}$ that is present between the second main electrode (source electrode) SA1 and first main electrode (drain electrode) DA1 of the first main semiconductor element QA11.

Like the bidirectional switching device of FIG. 7A, the first driver 811 includes an nMOS transistor (first reference semiconductor element) that is of the same type as the first main semiconductor element QA11. The first reference semiconductor element has drain and gate electrodes connected to those of the first main semiconductor element QA11. The first driver 811 also includes a first comparator. A positive input terminal of the first comparator is connected to the second main electrode (source electrode) SA1 of the first main semiconductor element QA11 through a resistor, and a negative input terminal of the first comparator is connected to a source electrode of the first reference semiconductor element through a resistor. The second driver 812 includes an nMOS transistor (second reference semiconductor element) that is of the same type as the second main semiconductor element QA2. The second reference semiconductor element has source and gate electrodes connected to those of the second main semiconductor element QA2, and a drain electrode connected to a reference resistor Rr. The second driver 812 also includes a second comparator. A positive input terminal of the second comparator is connected to the fourth main electrode (drain electrode) of the second main semiconductor element QA2 through a resistor, and a negative input terminal of the second comparator is connected to the drain electrode of the second reference semiconductor element through a resistor. The operation of the bidirectional switching device of FIG. 10 is basically the same as that of the bidirectional switching device of FIG. 7A. Namely, upon detecting an abnormal current, the first and second drivers 811 and 812 turn on and off the first and second main semiconductor elements QA11 and QA2 to generate current oscillations. The number of the current oscillations is measured to turn off the first and second main semiconductor elements QA11 and QA2.

Alternatively, the first main semiconductor element QA11 and second main semiconductor element QA2 may have a control circuit, or the thermal protector consisting of a resistor R57, a temperature sensor 121, a latch 122, and a thermal cutoff element QS2, like the bidirectional switching device of FIG. 7B. The thermal protector and the elements QA11 and QA2 are integrated on a single semiconductor chip. The temperature sensor 121 detects an increase in the temperature of the semiconductor chip on which the temperature sensor 121 and the elements QA11 and QA2 are integrated, and a signal from the temperature sensor 121 inverts the state of the latch 122, to turn on the thermal cutoff element QS2. This changes the gate potential of each of the first and second main semiconductor elements Q411 and QA2, to turn off the elements QA11 and QA2.

The first main semiconductor element QA11, second main semiconductor element QA2, first driver 811, and second driver 812 may be integrated on the same semiconductor substrate, to form a monolithic power IC that is small and light. Like the embodiment of FIG. 9; the first main semiconductor element QA11, first reference semiconductor element, second main semiconductor element QA2, and second reference semiconductor element may be integrated on a single semiconductor chip (power chip), and control circuit including the first and second drivers 811 and 812 on a separate semiconductor chip (control chip). The power chip and control chip are mounted on a package base, to form the MCM or the hybrid IC.

According to the present invention, semiconductor material is not limited to silicon (Si). It may be compound semiconductor material such as silicon carbide (SiC), heterojunction of germanium (Ge)—Si, heterojunction of SiC—Si, or else. When employing heterojunction the first main semiconductor element QA11 and second main semiconductor element QA2 may be composed of HEMTs or like transistors.

What is claimed is:

1. A bidirectional switching device for use in a semiconductor active fuse, comprising:
   (a) a p-channel first main semiconductor element having
      a first main electrode connected to an ungrounded side of an AC power source,
      a second main electrode connected opposite to the first main electrode, and
      a first control electrode for controlling a first main current flowing between the first and second main electrodes, wherein
      the first main semiconductor element contains a first parasitic diode whose cathode region is connected to the first main electrode and whose anode region is connected to the second main electrode, configured such that a second main current running opposite to the first main current flows in the first parasitic diode when the first main semiconductor element is in a cutoff state; and
   (b) an n-channel second main semiconductor element
      having a third main electrode connected to the second main electrode,
      a fourth main electrode connected opposite to the third main electrode and connected to a load, and
      a second control electrode for controlling the second main current flowing between the third and fourth main electrodes, configured such that the second main current flows in the second main semiconductor element when said first main semiconductor element is in the cutoff state, wherein the second main semiconductor element contains a second parasitic diode whose anode region is connected to the third main electrode and whose cathode region is connected to the fourth main electrode, configured such that the first main current flows in the second parasitic diode when the second main semiconductor element is in a cutoff state.

2. The bidirectional switching device of claim 1, wherein the first and second control electrodes are grounded through resistors when the bidirectional switching device is energized.

3. The bidirectional switching device of claim 2, wherein the first main semiconductor element consists of a plurality of first unit cells so as to form a multi-channel structure configured such that a larger part of the first main current flows in the first main semiconductor element than in the first reference semiconductor element.

4. The bidirectional switching device of claim 1, further comprising:

a first reference semiconductor element having a fifth main electrode connected to the first main electrode, a third control electrode connected to the first control electrode, and a sixth main electrode; and a second reference semiconductor element having a seventh main electrode connected to the third main electrode, a fourth control electrode connected to the second control electrode, and an eighth main electrode.

5. The bidirectional switching device of claim 4, wherein the second main semiconductor element consists of a plurality of second unit cells so as to form a multi-channel structure configured such that a larger part of the second main current flows in the second main semiconductor element than in the second reference semiconductor element.

6. The bidirectional switching device of claim 4, wherein the first main semiconductor element, first reference semiconductor element, second main semiconductor element, and second reference semiconductor element are integrated on the same semiconductor substrate.

7. The bidirectional switching device of claim 6, wherein the first main semiconductor element, first reference semiconductor element, second main semiconductor element, and second reference semiconductor element are formed in dielectrically isolated semiconductor areas, respectively.

8. The bidirectional switching device of claim 7, wherein the second, fourth, sixth, and eighth main electrodes are formed as buried regions at the bottoms of the semiconductor areas, respectively.

9. The bidirectional switching device of claim 4, wherein the first main semiconductor element, first reference semiconductor element, second main semiconductor element, and second reference semiconductor element are formed as discrete elements, which are arranged in a same package.

10. The bidirectional switching device of claim 9, wherein the first main semiconductor element, first reference semiconductor element, second main semiconductor element, and second reference semiconductor element are formed on discrete conductive plates, respectively, which are arranged on a surface of the same package base.

11. The bidirectional switching device of claim 10, wherein the second and third main electrodes are connected to each other as an internal structure of the package.

12. The bidirectional switching device of claim 1, further comprising:

a first thermal cutoff element connected to the first control electrode;

a second thermal cutoff element connected to the second control electrode;

a first latch circuit connected to a gate electrode of the first thermal cutoff element;

a second latch circuit connected to a gate electrode of the second thermal cutoff element;

a first temperature sensor for supplying a signal to the first latch circuit;

a second temperature sensor for supplying a signal to the second latch circuit, wherein the first and second temperature sensors detect heat generated by current oscillations occurring on the first and second main semiconductor elements and provides temperature signals, which are used to turn off the first and second main semiconductor elements, when the temperature signals exceed a threshold.

13. A bidirectional switching device for use in a semiconductor active fuse, comprising:

(a) an n-channel first main semiconductor element having a first main electrode connected to an ungrounded side of an AC power source, a second main electrode connected opposite to the first main electrode, and a first control electrode for controlling a first main current flowing between the first and second main electrodes, the first control electrode being adapted for connecting to a first driver that is stepped up by a charge pump, wherein the first main semiconductor element contains a first parasitic diode whose cathode region is connected to the first main electrode and whose anode region is connected to the second main electrode, configured such that a second main current running opposite to the first main current flows in the first parasitic diode when the first main semiconductor element is in a cutoff state; and (b) an n-channel second main semiconductor element having a third main electrode connected to the second main electrode, a fourth main electrode connected opposite to the third main electrode and connected to a load, and a second control electrode for controlling the second main current flowing between the third and fourth main electrodes, configured such that the second main current flows in the second main semiconductor element when the first main semiconductor element is in the cutoff state, the second control electrode being adapted for connecting to a second driver that is different from the first driver, wherein the second main semiconductor element contains a second parasitic diode whose anode region is connected to the third main electrode and whose cathode region is connected to the fourth main electrode, configured such that the first main current flows in the second parasitic diode when the second main semiconductor element is in a cutoff state.

14. The bidirectional switching device of claim 13, further comprising:

a first thermal cutoff element connected to the first control electrode;

a second thermal cutoff element connected to the second control electrode;

a first latch circuit connected to a gate electrode of the first thermal cutoff element;

a second latch circuit connected to a gate electrode of the second thermal cutoff element;

a first temperature sensor for supplying a signal to the first latch circuit;

a second temperature sensor for supplying a signal to the second latch circuit, wherein the first and second temperature sensors detect heat generated by current oscillations occurring on the first and second main semiconductor elements and provides temperature signals, which are used to turn off the first and second main semiconductor elements, when the temperature signals exceed a threshold.

15. A semiconductor active fuse comprising:

(a) a p-channel first main semiconductor element having a first main electrode connected to an ungrounded side of an AC power source,
a second main electrode connected opposite to the first main electrode, and
a first control electrode for controlling a first main current flowing between the first and second main electrodes, wherein
the first main semiconductor element contains a first parasitic diode whose cathode region is connected to the first main electrode and whose anode region is connected to the second main electrode, configured such that a second main current running opposite to the first main current flows in the first parasitic diode when the first main semiconductor element is in a cutoff state;

(b) an n-channel second main semiconductor element having a third main electrode connected to the second main electrode,
a fourth main electrode connected opposite to the third main electrode and connected to a load, and
a second control electrode for controlling the second main current flowing between the third and fourth main electrodes, configured such that the second main current flows in the second main semiconductor element when the first main semiconductor element is in the cutoff state, wherein
the second main semiconductor element contains a second parasitic diode whose anode region is connected to the third main electrode and whose cathode region is connected to the fourth main electrode, configured such that the first main current flows in the second parasitic diode when said second main semiconductor element is in a cutoff state;

(c) a first reference semiconductor element having a fifth main electrode connected to the first main electrode, a third control electrode connected to the first control electrode, and a sixth main electrode;

(d) a second reference semiconductor element having a seventh main electrode connected to the third main electrode, a fourth control electrode connected to the second control electrode, and an eighth main electrode;

(e) a first comparator for comparing voltages of the second and sixth main electrodes with each other; and (f) a second comparator for comparing voltages of the fourth and eighth main electrodes with each other.

16. The semiconductor active fuse of claim 15, wherein the first and second control electrodes are grounded through resistors, respectively, when an external switch is closed to start the semiconductor active fuse.

17. The semiconductor active fuse of claim 15, further comprising:

a first transistor connected between the first main electrode and a higher-level power supply terminal of the first comparator; and a resistor connected between a lower-level power supply terminal of the first comparator and a ground potential;

a second transistor connected between the second main electrode and a lower-level power supply terminal of the second comparator; and a resistor connected between a higher-level power supply terminal of the second comparator and the ground potential.

18. The semiconductor active fuse of claim 17, further comprising:

a third transistor whose emitter electrode is connected to the higher-level power supply terminal of the first comparator and whose base electrode is connected to an output terminal of the first comparator; and a fourth transistor whose emitter electrode is connected to the lower-level power supply terminal of the second comparator and whose base electrode is connected to an output terminal of the second comparator.

19. The semiconductor active fuse of claim 18, further comprising:

a reverse current preventive diode connected to a collector electrode of the third transistor; and an ON/OFF accumulator connected to the reverse current preventive diode.

20. The semiconductor active fuse of claim 19, further comprising:

a bridge circuit consisting of four diodes connected between the first main electrode and the ground potential.

21. The semiconductor active fuse of claim 20, further comprising:

a power source capacitor connected between two middle points of the bridge circuit; and a series circuit consisting of a power source resistor and a power source Zener diode, connected between ends of the power source capacitor, wherein:

a terminal potential of the power source Zener diode is used as a power supply voltage for the ON/OFF accumulator.

22. The semiconductor active fuse of claim 15, further comprising:

a first thermal cutoff element connected to the first control electrode;

a second thermal cutoff element connected to the second control electrode;

a first latch circuit connected to a gate electrode of the first thermal cutoff element;

a second latch circuit connected to a gate electrode of the second thermal cutoff element;

a first temperature sensor for supplying a signal to the first latch circuit;

a second temperature sensor for supplying a signal to the second latch circuit, wherein the first and second temperature sensors detect heat generated by current oscillations occurring on the first and second main semiconductor elements and provides temperature signals, which are used to turn off the first and second main semiconductor elements, when the temperature signals exceed a threshold.

* * * * *